(12) United States Patent
Yu et al.

(10) Patent No.: US 12,315,831 B2
(45) Date of Patent: May 27, 2025

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Chen-Hua Yu, Hsinchu (TW); Kuo-Chung Yee, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/474,234

(22) Filed: Sep. 26, 2023

(65) Prior Publication Data

US 2024/0014151 A1 Jan. 11, 2024

Related U.S. Application Data

(60) Continuation of application No. 17/219,905, filed on Apr. 1, 2021, now Pat. No. 11,804,457, which is a
(Continued)

(51) Int. Cl.
*H01L 23/538* (2006.01)
*H01L 21/48* (2006.01)
(Continued)

(52) U.S. Cl.
CPC .......... *H01L 23/66* (2013.01); *H01L 21/4853* (2013.01); *H01L 21/4857* (2013.01); *H01L 21/486* (2013.01); *H01L 21/565* (2013.01); *H01L 21/568* (2013.01); *H01L 21/6835* (2013.01); *H01L 21/78* (2013.01); *H01L 23/3114* (2013.01); *H01L 23/3128* (2013.01);
(Continued)

(58) Field of Classification Search
CPC ... H01L 2223/6677; H01L 2225/06572; H01L 23/5386
See application file for complete search history.

(56) References Cited

U.S. PATENT DOCUMENTS 9,000,584 B2  4/2015  Lin et al.
9,048,222 B2  6/2015  Hung et al.
(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A package structure has a first die, a second die, the third die, a molding compound, a first redistribution layer, an antenna and conductive elements. The first die, the second die and the third die are molded in a molding compound. The first redistribution layer is disposed on the molding compound and is electrically connected to the first die, the second die and the third die. The antenna is located on the molding compound and electrically connected to the first die, the second die and the third die, wherein a distance of an electrical connection path between the first die and the antenna is smaller than or equal to a distance of an electrical connection path between the second die and the antenna and a distance of an electrical connection path between the third die and the antenna. The conductive elements are connected to the first redistribution layer, wherein the first redistribution layer is located between the conductive elements and the molding compound.

20 Claims, 29 Drawing Sheets

Related U.S. Application Data continuation of application No. 16/869,573, filed on May 7, 2020, now Pat. No. 10,971,462, which is a continuation of application No. 16/043,107, filed on Jul. 23, 2018, now Pat. No. 10,651,137, which is a division of application No. 15/253,897, filed on Sep. 1, 2016, now Pat. No. 10,032,722.

(60) Provisional application No. 62/343,128, filed on May 31, 2016.

(51) Int. Cl.

| | | |
|---|---|---|
| *H01L 21/56* | (2006.01) | |
| *H01L 21/683* | (2006.01) | |
| *H01L 21/78* | (2006.01) | |
| *H01L 23/00* | (2006.01) | |
| *H01L 23/31* | (2006.01) | |
| *H01L 23/66* | (2006.01) | |
| *H01L 25/00* | (2006.01) | |
| *H01L 25/065* | (2023.01) | |
| *H01Q 1/22* | (2006.01) | |
| *H01Q 21/00* | (2006.01) | |

(52) U.S. Cl.
CPC ...... *H01L 23/5383* (2013.01); *H01L 23/5384* (2013.01); *H01L 23/5386* (2013.01); *H01L 23/5389* (2013.01); *H01L 24/19* (2013.01); *H01L 24/20* (2013.01); *H01L 25/0652* (2013.01); *H01L 25/50* (2013.01); *H01Q 1/2283* (2013.01); *H01Q 21/0087* (2013.01); *H01L 23/5385* (2013.01); *H01L 25/0655* (2013.01); *H01L 2221/68372* (2013.01); *H01L 2223/6616* (2013.01); *H01L 2223/6677* (2013.01); *H01L 2223/6683* (2013.01); *H01L 2223/6688* (2013.01); *H01L 2224/04105* (2013.01); *H01L 2224/12105* (2013.01); *H01L 2224/16227* (2013.01); *H01L 2224/18* (2013.01); *H01L 2224/214* (2013.01); *H01L 2224/32145* (2013.01); *H01L 2224/32225* (2013.01); *H01L 2224/73204* (2013.01); *H01L 2224/73253* (2013.01); *H01L 2224/73267* (2013.01); *H01L 2224/81005* (2013.01); *H01L 2224/92244* (2013.01); *H01L 2225/06524* (2013.01); *H01L 2225/06548* (2013.01); *H01L 2225/06555* (2013.01); *H01L 2225/06558* (2013.01); *H01L 2225/06572* (2013.01); *H01L 2225/06586* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2011/0291288 A1* | 12/2011 | Wu ................ H01L 24/81 257/773 |
| 2012/0056316 A1* | 3/2012 | Pagaila ............ H01L 24/97 257/737 |
| 2014/0168014 A1* | 6/2014 | Chih ............... H01Q 1/36 438/108 |

* cited by examiner

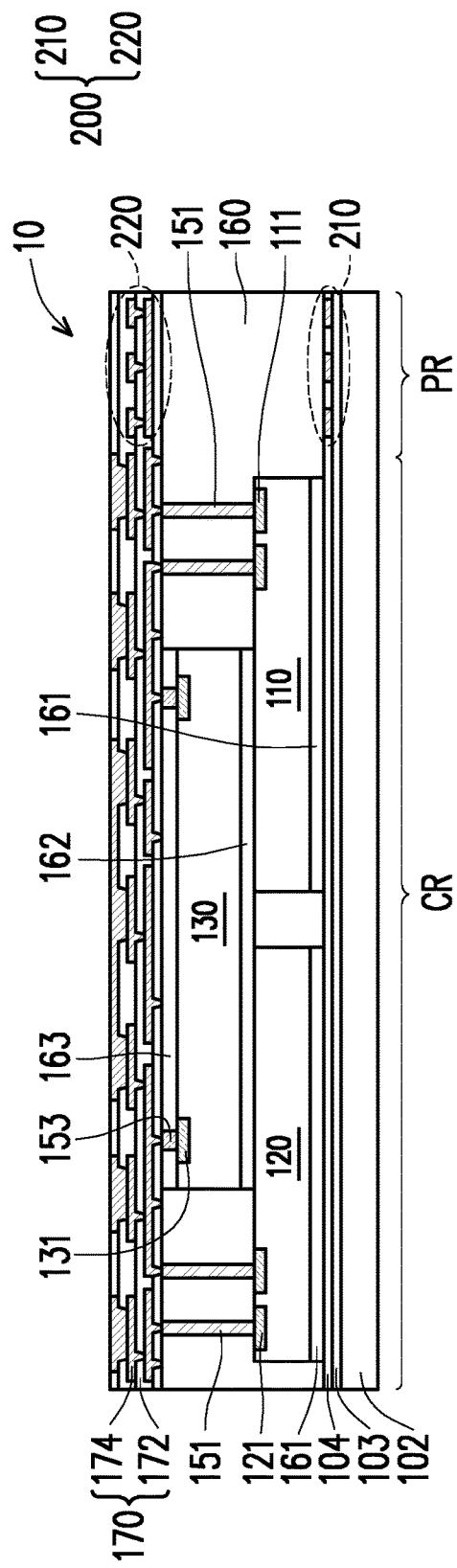
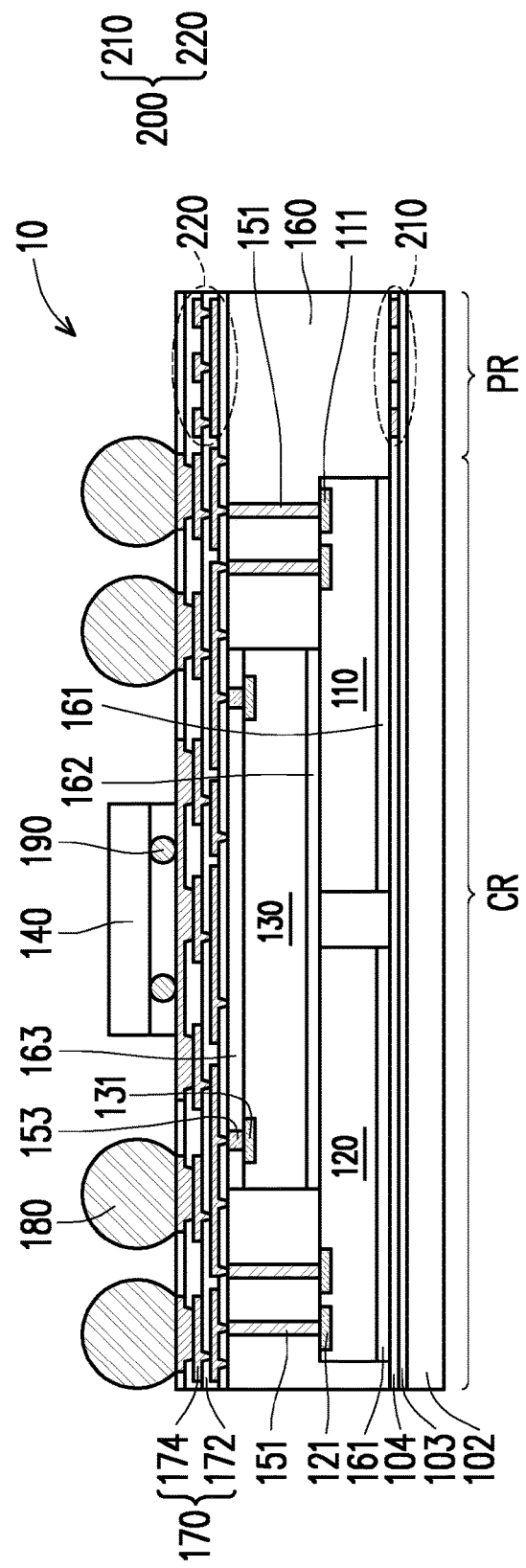

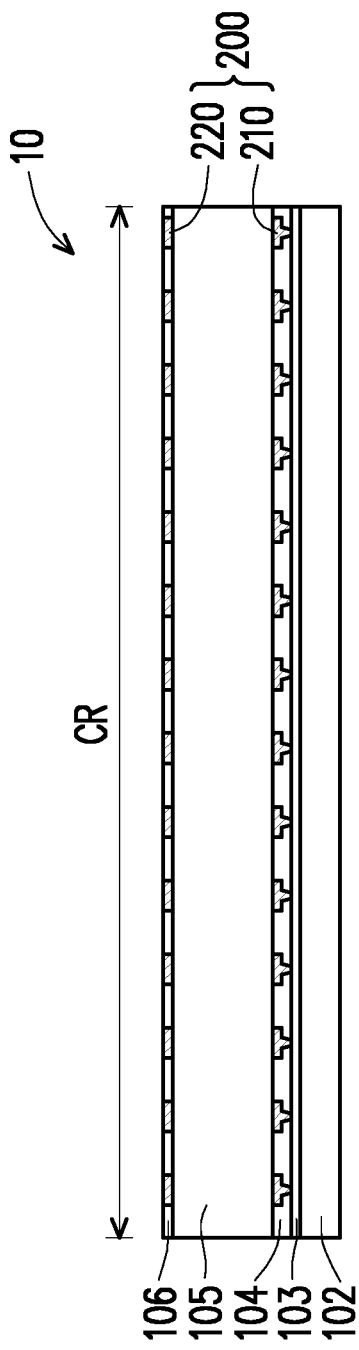
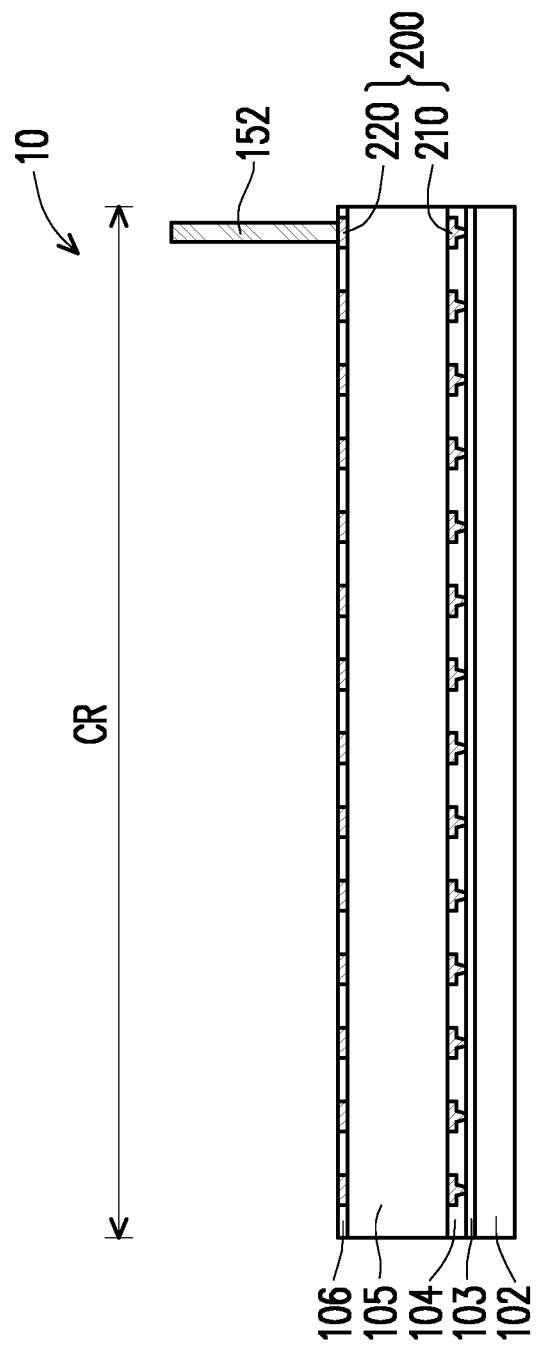

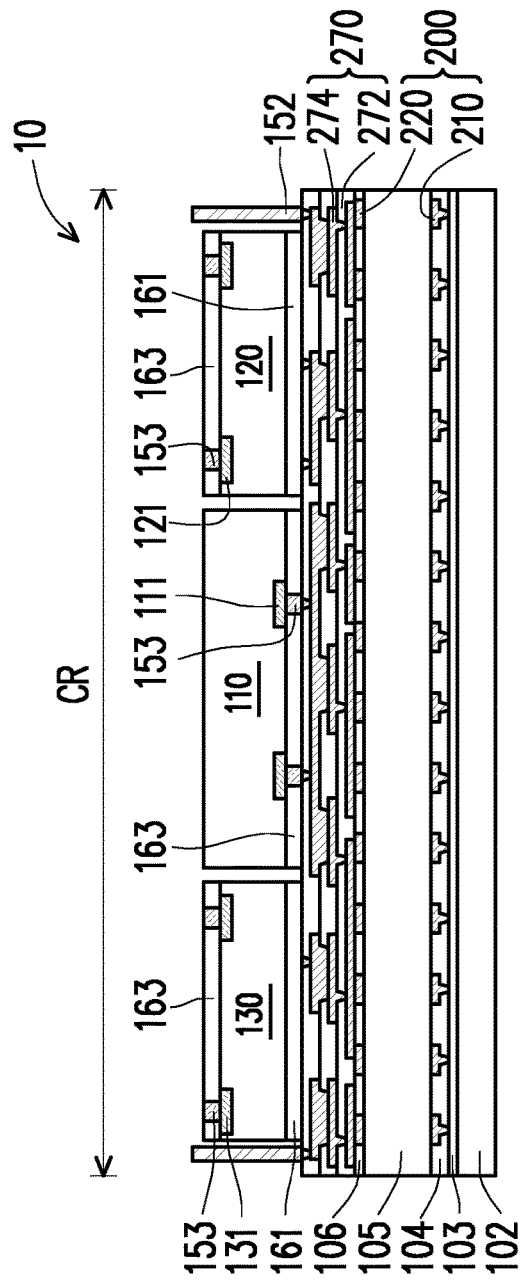
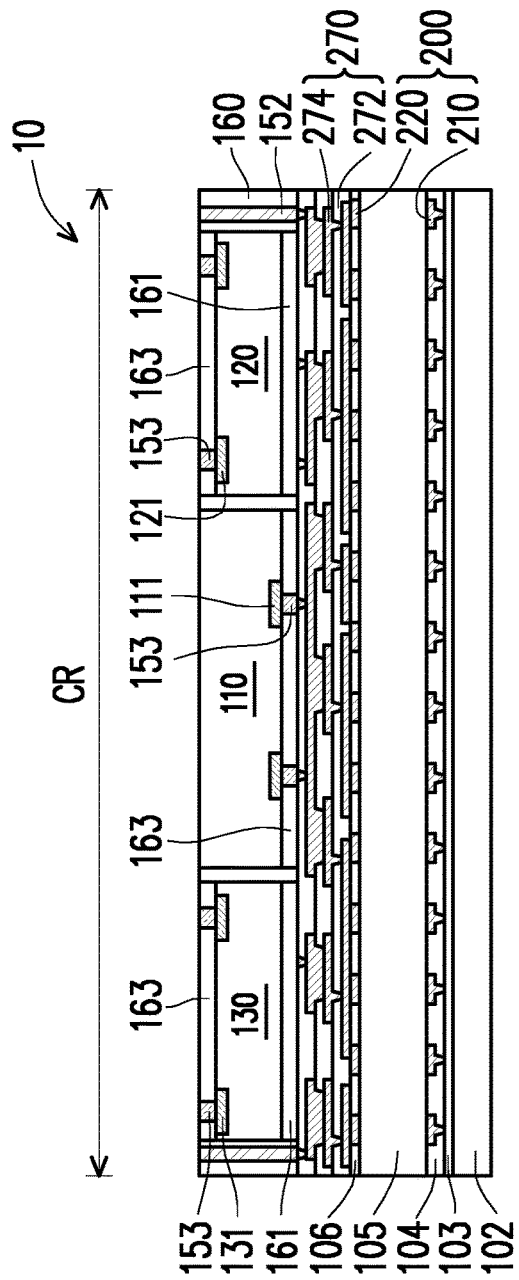
FIG. 5A
FIG. 5B

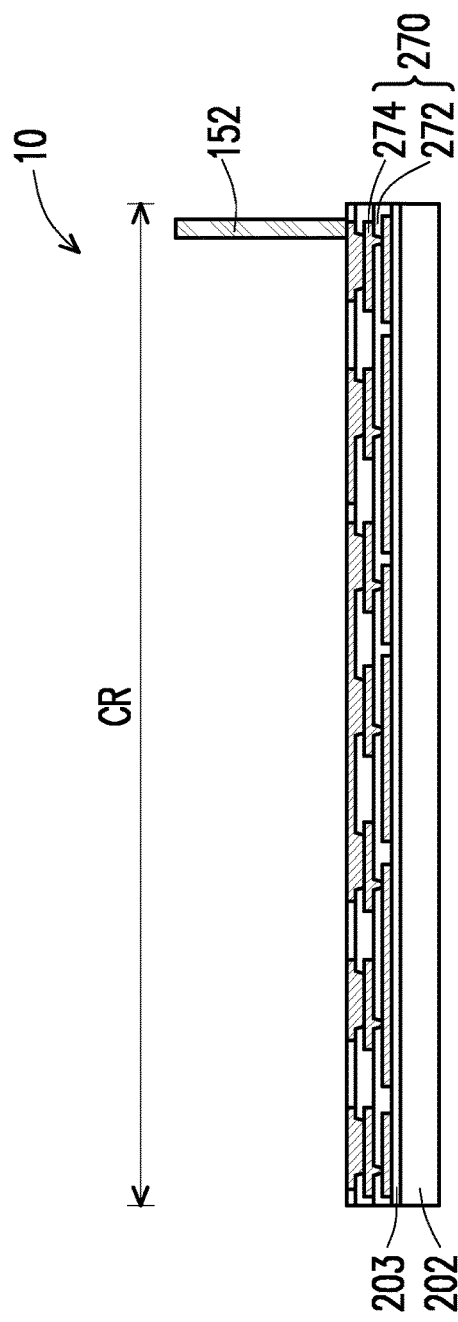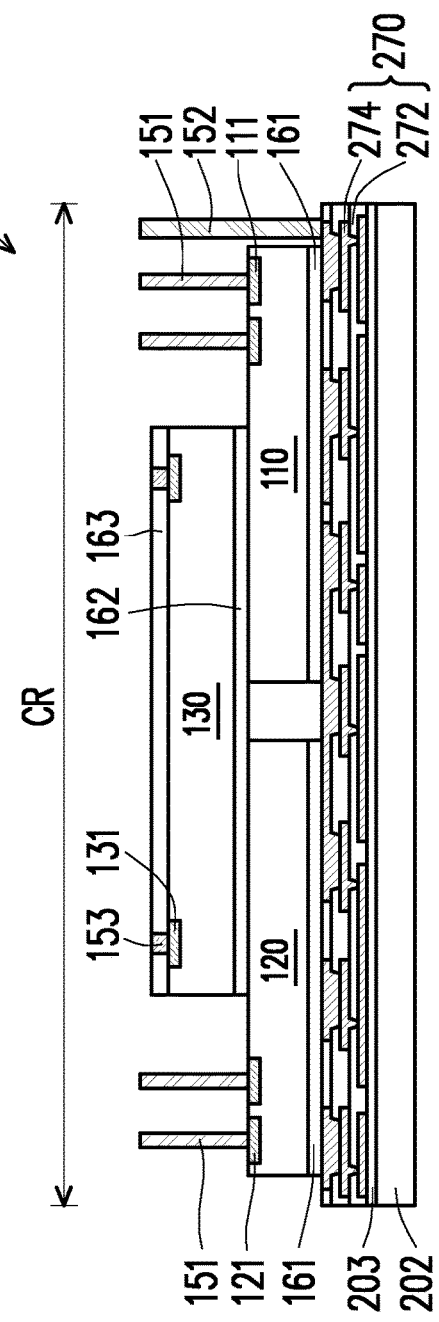

PACKAGE STRUCTURE AND MANUFACTURING METHOD THEREOF

CROSS-REFERENCE TO RELATED APPLICATION

This application is a continuation application of and claims the priority benefit of a prior U.S. patent application Ser. No. 17/219,905, filed on Apr. 1, 2021. The prior U.S. patent application Ser. No. 17/219,905 is a continuation application of and claims the priority benefits of U.S. application Ser. No. 16/869,573, filed on May 7, 2020. The prior U.S. application Ser. No. 16/869,573 is a continuation application of and claims the priority benefit of a prior U.S. application Ser. No. 16/043,107, filed on Jul. 23, 2018. The prior application Ser. No. 16/043,107 is a divisional application of and claims the priority benefits of U.S. application Ser. No. 15/253,897, filed on Sep. 1, 2016, which claims the priority benefit of U.S. provisional application Ser. No. 62/343,128, filed on May 31, 2016. The entirety of each of the above-mentioned patent applications is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1G are schematic cross sectional views of various stages in a manufacturing method of a package structure according to some exemplary embodiments of the present disclosure.

FIG. 3A to FIG. 3G are schematic cross sectional views of various stages in a manufacturing method of a package structure according to some exemplary embodiments of the present disclosure.

FIG. 5A to FIG. 5E are schematic cross sectional views of various stages in a manufacturing method of a package structure according to some exemplary embodiments of the present disclosure.

FIG. 9A to FIG. 9I are schematic cross sectional views of various stages in a manufacturing method of a package structure according to some exemplary embodiments of the present disclosure.

DETAILED DESCRIPTION

Figure 1A:
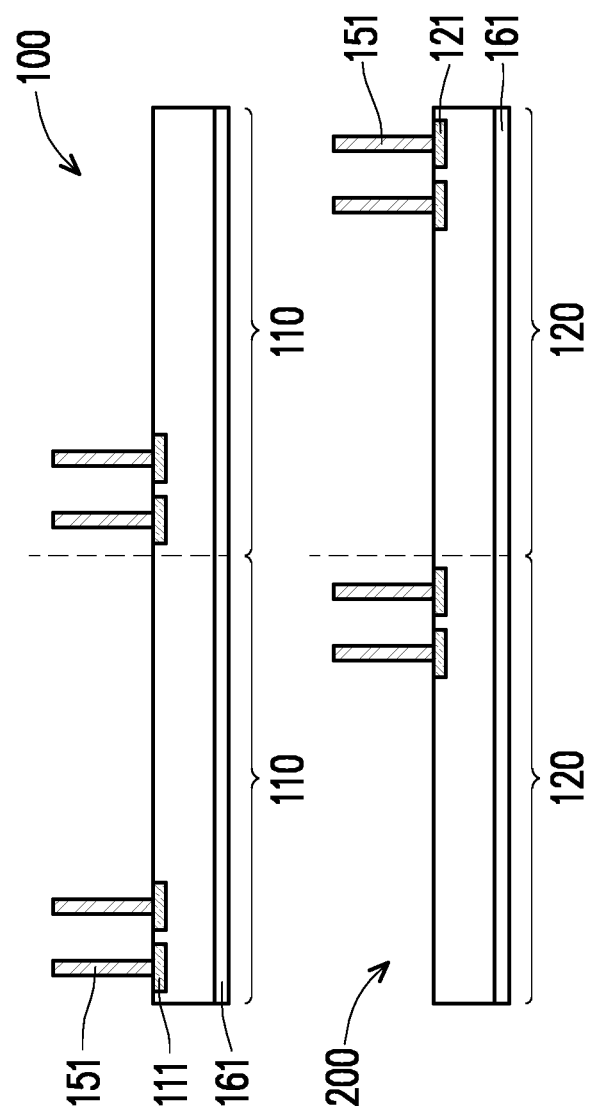

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross sectional views of various stages in a manufacturing method of a package structure according to some exemplary embodiments of the present disclosure. In exemplary embodiments, the manufacturing method is part of a wafer level packaging process. In some embodiments, two dies are shown to represent plural dies of the wafer, and a package 10 is shown to represent a package structure obtained following the manufacturing method.

Referring to FIG. 1A, in some embodiments, a wafer 100 including first dies 110 and a wafer 200 including second dies 120 are provided, and a dicing process is performed to cut the wafer 100 and the wafer 200 along a cutting line (shown as the dotted line in FIG. 1A) into individual and separated first dies 110 and second dies 120. In one embodiment, the dicing process is a wafer dicing process. In certain embodiments, before performing the dicing process, first through interlayer vias (TIVs) 151 are formed on the contacts 111, 121 of each first die 110 and each second die 120, and are electrically connected to the first die 110 and the second die 120. In some embodiments, the first TIVs 151 are through integrated fan-out (InFO) vias. In one embodiment, the first TIVs 151 may be formed by forming a mask pattern (not shown) covering the first dies 110 and the second die 120 with openings exposing the contacts 111, 121, forming a metallic material filling the openings to form the first TIVs 151 by electroplating or deposition and then removing the mask pattern. In some embodiments, before the dicing process, a die attach film 161 is provided to bottom surfaces of the first wafer 100 and the second wafer 200.

Figure 1B:
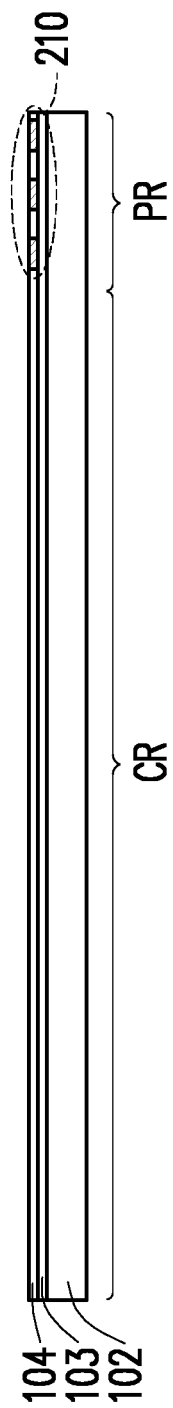

Referring to FIG. 1B, in some embodiments, a carrier 102 is provided, the carrier 102 may be a glass carrier or any suitable carrier for the manufacturing method of the package structure. In some embodiments, the carrier 102 is provided with a debond layer 103 coated thereon, and the material of the debond layer 103 may be any material suitable for debonding the carrier 102 from the above layers disposed thereon. In certain embodiments, the carrier 102 has a central region CR and a periphery region PR surrounding the central region CR, and a dielectric layer 104 is formed to cover the central region CR of the carrier 102 and a first metallic portion 210 is formed in the periphery region PR of the carrier 102. In exemplary embodiments, the dielectric layer 104 and the first metallic portion 210 are formed by forming a dielectric material layer (not shown) over the carrier 102, patterning the dielectric material layer, forming a metallization layer (not shown) by electroplating or deposition over the patterned dielectric material layer to form the dielectric layer 104 covering the central region CR and the first metallic portion 210 (part of an antenna) in the periphery region PR.

Figure 1C:
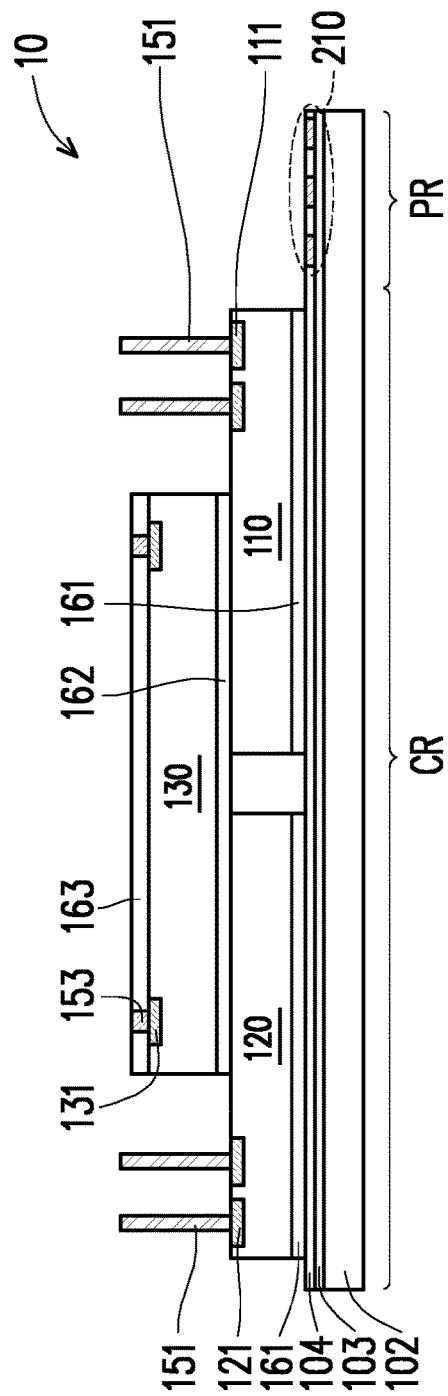

Referring to FIG. 1C, one or more third dies 130 are provided. In some embodiments, the first die 110, the second die 120, and the third die 130 are disposed on the dielectric layer 104 and over the carrier 102. In one embodiment, the first die 110 is arranged aside of the second die 120, while the third die 130 is stacked on the first and second dies 110, 120. In certain embodiments, the first die 110, the second die 120 and the third die 130 are disposed in the central region CR and are not overlaid with the first metallic portion 210 located in the periphery region. In some embodiments, due to the die attach film 161 provided between the first die 110, the second die 120 and the dielectric layer 104, the first die 110 and the second die 120 are stably adhered to the dielectric layer 104. In some embodiments, a second die attach film 162 is provided between a back surface of the third die 130 and top surfaces of the first die 110 and the second die 120 for better adhering the third die 130 to the first die 110 and the second die 120. In certain embodiments, as shown in FIG. 1C, the first die 110, the second die 120 and the third die 130 are front-to-back attached. In some embodiments, the third die 130 is provided with a protection layer 163 covering a top surface of the third die 130 with openings exposing contacts 131 of the third die 130 and contacting posts 153 filled in the openings and located on the contacts 131 of the third die 130. In some embodiments, the material of the contacting posts 153 includes copper and/or copper alloys. In some embodiments, the material of the protection layer 163 may include silicon oxide, silicon nitride, silicon oxynitride, or any suitable dielectric material.

In some embodiments, the first die 110, the second die 120 and the third die 130 are different types of dies or the same types of dies and may be individually selected from application-specific integrated circuit (ASIC) chips, analog chips (for example, wireless and radio frequency chips, e.g., 2.4 GHz radio frequency chip, 5 GHz radio frequency chip, a combined 2.4 GHz/5 GHz radio frequency chip, a millimeter wave radio frequency chip of 28 GHz, 39 GHz or 60 GHz, and the like radio frequency chip), digital chips (for example, a baseband chip of 28 GHz, 39 GHz or 60 GHz, and the like baseband chip), integrated passive devices (IPDs), voltage regulator chips, sensor chips, memory chips, or the like. Throughout this patent disclosure, a 60 GHz radio frequency chip and a 60 GHz baseband chip are used as a millimeter wave example for embodiment discussions. However, the disclosure is not limited thereto. In certain embodiments, as shown in FIG. 1C, the first die 110 is a 60 GHz radio frequency chip, the second die 120 is a 2.4 GHz radio frequency chip or a 5 GHz radio frequency chip, or a combined 2.4 GHz/5 GHz radio frequency chip, and the third die 130 is a 60 GHz baseband chip. Due to the dies of different types in the package structure 10 are stacked at different levels, the package structure 10 has small form factor and further has a much wider frequency range application. In an alternative embodiment, the first die 110 is a 60 GHz radio frequency chip, the second die 120 is a 60 GHz baseband chip, and the third die 130 is a 2.4 GHz radio frequency chip or a 5 GHz radio frequency chip, or a combined 2.4 GHz/5 GHz radio frequency chip. In an alternative embodiment, the first die 110 is a 60 GHz baseband chip, the second die 120 is a 2.4 GHz radio frequency chip or a 5 GHz radio frequency chip, or a combined 2.4 GHz/5 GHz radio frequency chip, and the third die 130 is a 60 GHz radio frequency chip. However, the disclosure is not limited thereto.

Figure 1D:
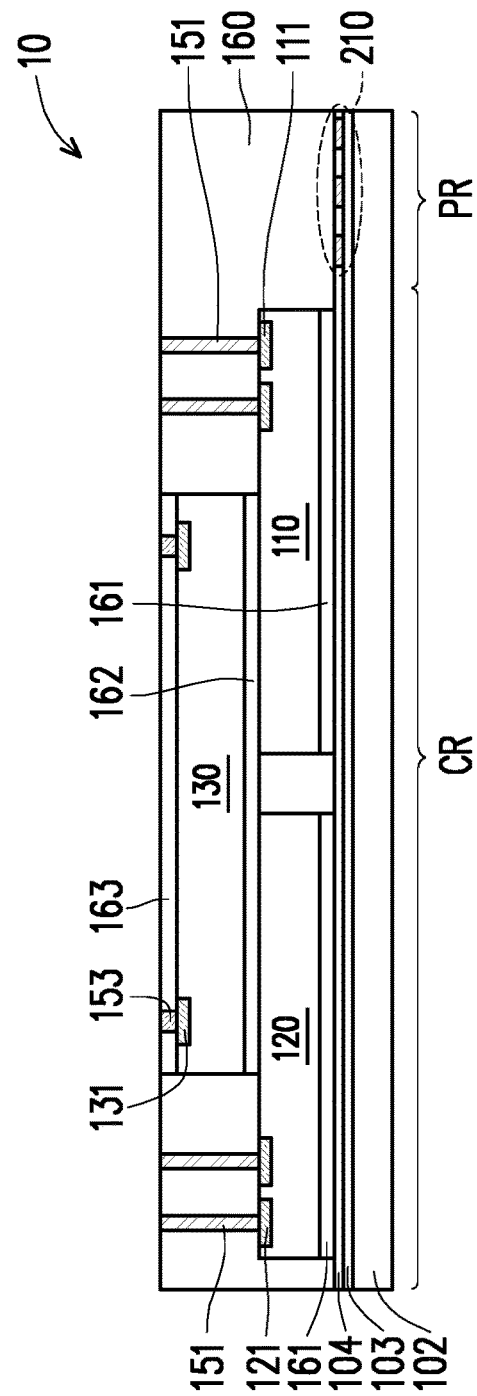

Referring to FIG. 1D, in some embodiments, the first die 110, the second die 120, the third die 130 and the first TIVs 151 are molded and encapsulated in a molding compound 160. In one embodiment, the molding compound 160 at least fills the space between the first die 110, the second die 120, the third die 130 and the first TIVs 151, and covers the patterned dielectric layer 104 and the first metallic portion 210. In some embodiments, the molding compound 160 is planarized to expose top surfaces of the first TIVs 151, the contacting posts 153 and the protection layer 163. In certain embodiments, as shown in FIG. 1D, after the planarization, top surfaces of the first TIVs 151 and the molding compound 160 become substantially levelled. In one embodiment, the top surfaces of the first TIVs 151, the contacting posts 153, the molding compound 160 and the protection layer 163 are coplanar. In one embodiment, the material of the molding compound 160 includes epoxy resins, phenolic resins or silicon-containing resins. In some embodiments, the molding compound 160 and the first TIVs 151 are planarized through a grinding process or a chemical mechanical polishing (CMP) process.

Referring to FIG. 1E, in some embodiments, a first redistribution layer 170 is formed on the molding compound 160, the first TIVs 151 and the third die 130. In some embodiments, the first redistribution layer 170 is electrically connected to the first die 110 and the second die 120 via the first TIVs 151 and is electrically connected to the third die 130 via the contacting posts 153. The formation of the first redistribution layer 170 includes sequentially forming one or more polymer dielectric layers 172 and one or more metallization layers 174 in alternation. In certain embodiments, as shown in FIG. 1E, the metallization layers 174 are sandwiched between the polymer dielectric layers 172, but the top surface of the topmost layer of the metallization layers 174 is exposed and the lowest layer of the metallization layers 174 is connected to the first TIVs 151 and the contacting posts 153 of the third die 110. In some embodiments, the material of the metallization layers 174 includes aluminum, titanium, copper, nickel, tungsten, and/or alloys thereof, and the metallization layers 174 may be formed by electroplating or deposition. In some embodiments, the material of the polymer dielectric layers 172 includes polyimide, epoxy resin, acrylic resin, phenol resin, benzocyclobutene (BCB), polybenzooxazole (PBO), or any other suitable polymer-based dielectric material.

In certain embodiments, as shown in FIG. 1E, a portion of the metallization layers 174 of the first redistribution layer 170 located in the periphery region PR forms a second metallic portion 220. The first metallic portion 210 and the second metallic portion 220 located at different sides of the molding compound 160 constitute an antenna 200 and work together for antenna applications. In some embodiments, the antenna 200 is electrically connected to the first die 110, the second die 120 and the third die 130. Through the first redistribution layer 170, the contacting posts 153 and/or the first TIVs 151, electrical connection paths from the antenna 200 to the first die 110, the second die 120 and the third die 130 are established. In some embodiments, a distance of the electrical connection path between the first die 110 and the antenna 200 is smaller than or equal to a distance of the electrical connection path between the second die 120 and the antenna 200 and is smaller than or equal to a distance of the electrical connection path between the third die 130 and the antenna 200. With such specific distance condition, the package structure 10 has better electrical performance.

Referring to FIG. 1F, in some embodiments, conductive elements 180 are disposed on the topmost metallization layer 174 of the first redistribution layer 170. In some embodiments, prior to disposing the conductive elements 180, solder paste (not shown) or flux is applied so that the conductive elements 180 are better fixed to the topmost metallization layer 174. In some embodiments, the conductive elements 180 are, for example, solder balls or ball grid array (BGA) balls placed on the exposed topmost metallization layer 174 of the first redistribution layer 170 and parts of the topmost metallization layer 174 underlying the conductive elements 180 function as UBM layers. In some embodiments, some of the conductive elements 180 are electrically connected to the first die 110 and some of the conductive elements 180 are electrically connected to the second die 120 through the first redistribution layer 170 and the first TIVs 151, and some of the conductive elements 180 are electrically connected to the third die 130 through the first redistribution layer 170 and the contacting posts 153.

Referring to FIG. 1F, in some embodiments, a fourth die 140 is disposed on the top surface of the first redistribution layer 170 with connectors 190 there-between. In one embodiment, the fourth die 140 is joined to the first redistribution layer 170 after the conductive elements 180 are disposed. In some embodiments, the fourth die 140 is connected to the metallization layer 174 of the first redistribution layer 170 through flip chip bonding technology. In some embodiments, the connectors 190 are, for example, bumps and parts of the topmost metallization layer 174 underlying the connectors 190 function as bump pads. In some embodiments, the fourth die 140 includes integrated passive components (IPDs) such as capacitors, resistors, inductors, and transducers, or the fourth die 140 is a voltage regulator chip, a sensor chip, a memory chip or the like.

In some embodiments, some of the conductive elements 180 and the fourth die 140 are electrically connected through the first redistribution layer 170. In some embodiments, the fourth die 140 may be electrically connected to the first die 110 and the second die 120 through the connectors 190, the first redistribution layer 170 and the first TIVs 151, and may be electrically connected to the third die 110 through the connectors 190, the first redistribution layer 170 and the contacting post 153. In one embodiment, the fourth die 140 and some of the conductive elements 180 are electrically connected to the antenna 200.

Figure 1G:
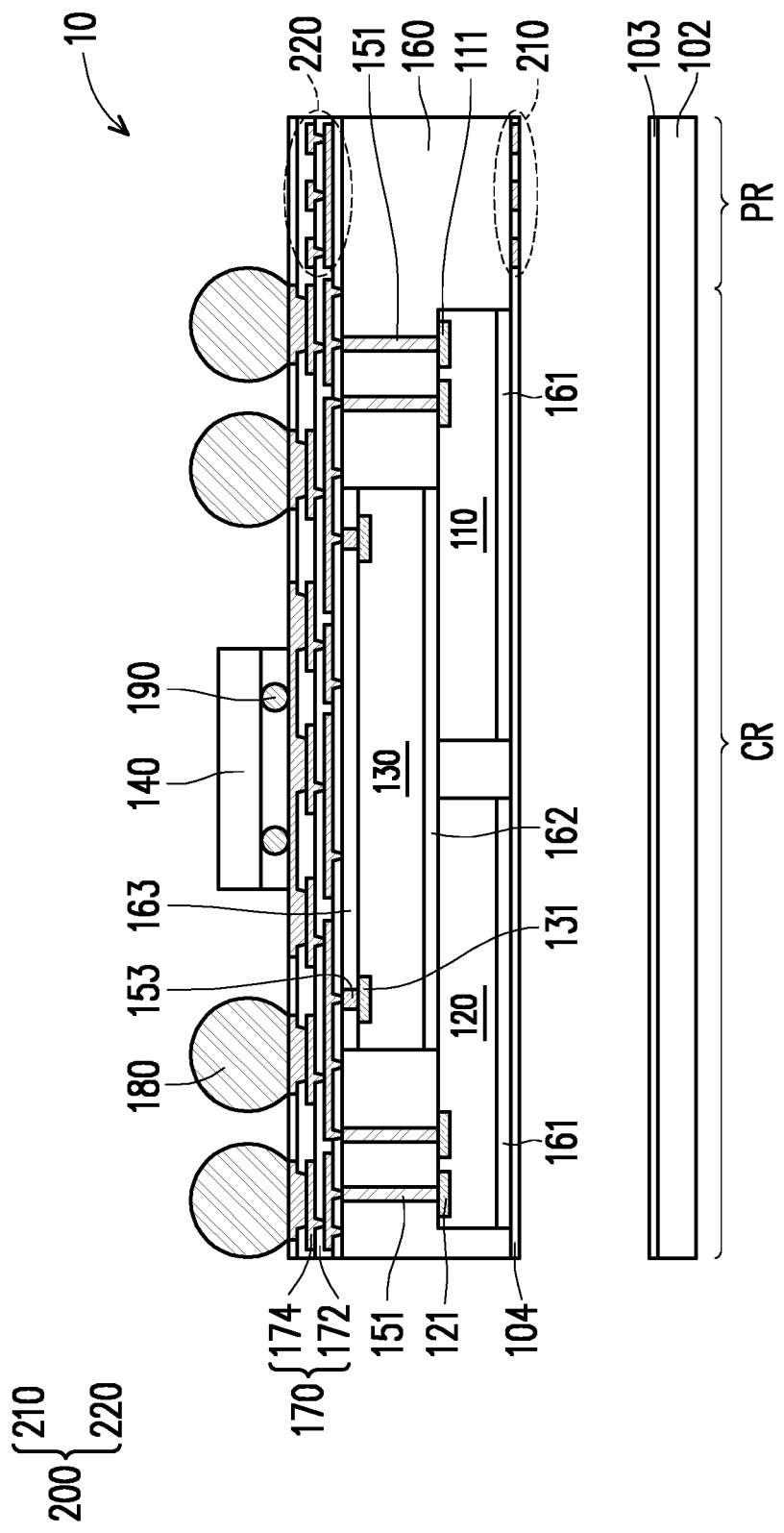

Referring to FIG. 1G, in some embodiments, the carrier 102 is debonded from the dielectric layer 104 to form the package structure 10. In some embodiments, the dielectric layer 104 is easily separated from the carrier 102 due to the debond layer 103, and the first metallic portion 210 of the antenna 200 may be exposed.

Figure 2:
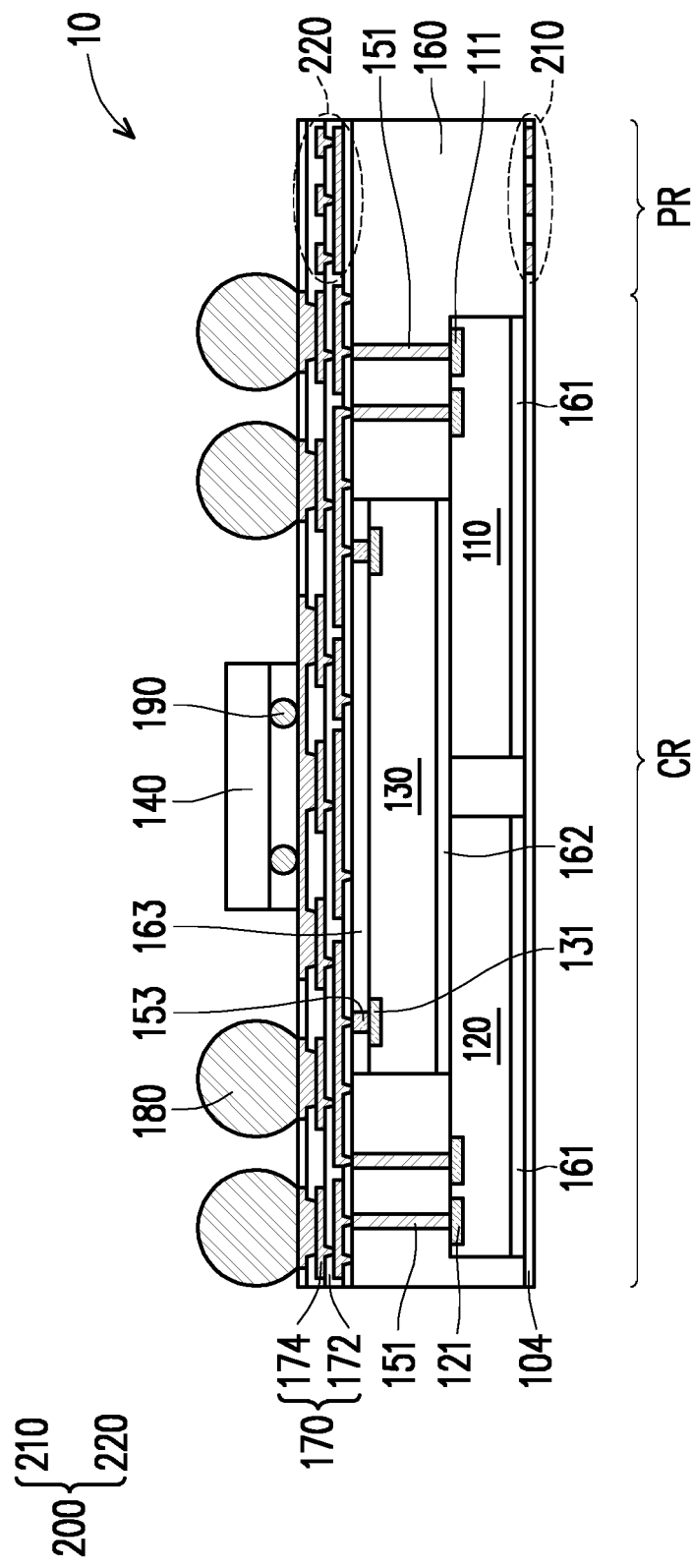
FIG. 2 is a schematic cross sectional view illustrating a package structure according to some exemplary embodiments of the present disclosure.

FIG. 2 is a schematic cross sectional view illustrating a package structure according to some exemplary embodiments. The package structure 10 of FIG. 2 may be fabricated following the previously described manufacturing process as described in FIG. 1A-1G. Referring to FIG. 2, in some embodiments, the package structure 10 includes the first die 110, the second die 120, the third die 130, the molding compound 160, the first redistribution layer 170, the antenna 200, the fourth die 140 and the conductive elements 180. In some embodiments, the first die 110 and the second die 120 are disposed on the dielectric layer 104, the third die 130 is stacked over the first die 110 and the second die 120. In some embodiments, the first TIVs 151 are in direct contact with the contacts 111, 121 of the first die 110 and the second die 120, and the contacting posts 153 located in the protection layer 163 are in direct contact with the contacts 131. In one embodiment, the first die 110, the second die 120, the third die 130, and the first TIVs 151 are encapsulated by the molding compound 160, the first TIVs 151 and the contacting posts 153 are in contact with the first redistribution layer 170. In some embodiments, the first redistribution layer 170 is electrically connected to the first die 110, the second die 120 and the third die 130.

In some embodiments, the molding compound 160 is located between the dielectric layer 104 and the first redistribution layer 170. In some embodiments, the fourth die 140 and the conductive elements 180 are disposed on the first redistribution layer 170, and the first redistribution layer 170 is located between the fourth die 140 and the molding compound 160 and between the conductive elements 180 and the molding compound 160. In some embodiments, the conductive elements 180 are electrically connected to the first redistribution layer 170 and electrically connected to the first die 110, the second die 120 and/or the third die 130 through the first redistribution layer 170, the first TIVs 151 and the contacting posts 153. In one embodiment, the fourth die 140 is electrically connected to the first redistribution layer 170 through the connectors 190.

In certain embodiments, as shown in FIG. 2, the first die 110 is a 60 GHz radio frequency chip, the second die 120 is a 2.4 GHz radio frequency chip or a 5 GHz radio frequency chip, or a combined 2.4 GHz/5 GHz radio frequency chip, and the third die 130 is a 60 GHz baseband chip. In one alternative embodiment, the first die 110 is a 60 GHz radio frequency chip, the second die 120 is a 60 GHz baseband chip, and the third die 130 is a 2.4 GHz radio frequency chip or a 5 GHz radio frequency chip, or a combined 2.4 GHz/5 GHz radio frequency chip. In another alternative embodiment, the first die 110 is a 60 GHz baseband chip, the second die 120 is a 2.4 GHz radio frequency chip or a 5 GHz radio frequency chip, and the third die 130 is a 60 GHz radio frequency chip.

In one embodiment, the first metallic portion 210 of the antenna 200 located in the periphery region PR of the carrier 102, and the second metallic portion 220 located in the periphery region PR of the first redistribution layer 170 are located at different sides of the molding compound 160. In some embodiments, a distance of the electrical connection path between the first die 110 and the antenna 200 is smaller than or equal to a distance of the electrical connection path between the second die 120 and the antenna 200 and is smaller than or equal to a distance of the electrical connection path between the third die 130 and the antenna 200, which allows better electrical performance of the package structure 10.

FIG. 3A to FIG. 3G are schematic cross sectional views of various stages in a manufacturing method of a package structure according to some exemplary embodiments of the present disclosure. The elements similar to or substantially the same as the elements described previously will use the same reference numbers, and certain details or descriptions of the same elements may not be repeated herein.

Referring in FIG. 3A, in some embodiments, the antenna 200 is formed on the debond layer 103 disposed on the central region CR of the carrier 102. In alternative embodiments, the antenna 200 is sequentially formed on the carrier 102, and the materials of the antenna 200 and the formation methods similar to the processes for forming the first metallic portion 210 and the second metallic portion 220 as described in FIGS. 1B and 1E may not be repeated herein. In certain embodiments, the methods of forming the antenna 200 include forming the dielectric layer 104 in the central region CR of the carrier 102 and forming the first metallic portion 210 of the antenna 200 in the central region CR of the carrier 102 not covered by the dielectric layer 104. A dielectric material layer 105 is formed over and covers the dielectric layer 104 and the first metallic portion 210 of the antenna 200. A dielectric layer 106 is formed on the dielectric material layer 105 and the second metallic portion 220 is formed on the dielectric material layer 105 exposed by the dielectric layer 106. In some embodiments, the location of the first metallic portion 210 corresponds to that of the second metallic portion 220, and the first metallic portion 210 and the second metallic portion 220 of the antenna 200 work together for antenna applications.

Referring to FIG. 3B, in some embodiments, one or more second through interlayer vias (TIVs) 152 are formed on the second metallic portion 220 of the antenna 200, and the second TIV 152 is directly connected to the second metallic portion 220 of the antenna 200. In some embodiments, the second TIV 152 is a through integrated fan-out (InFO) via.

Figure 3C:
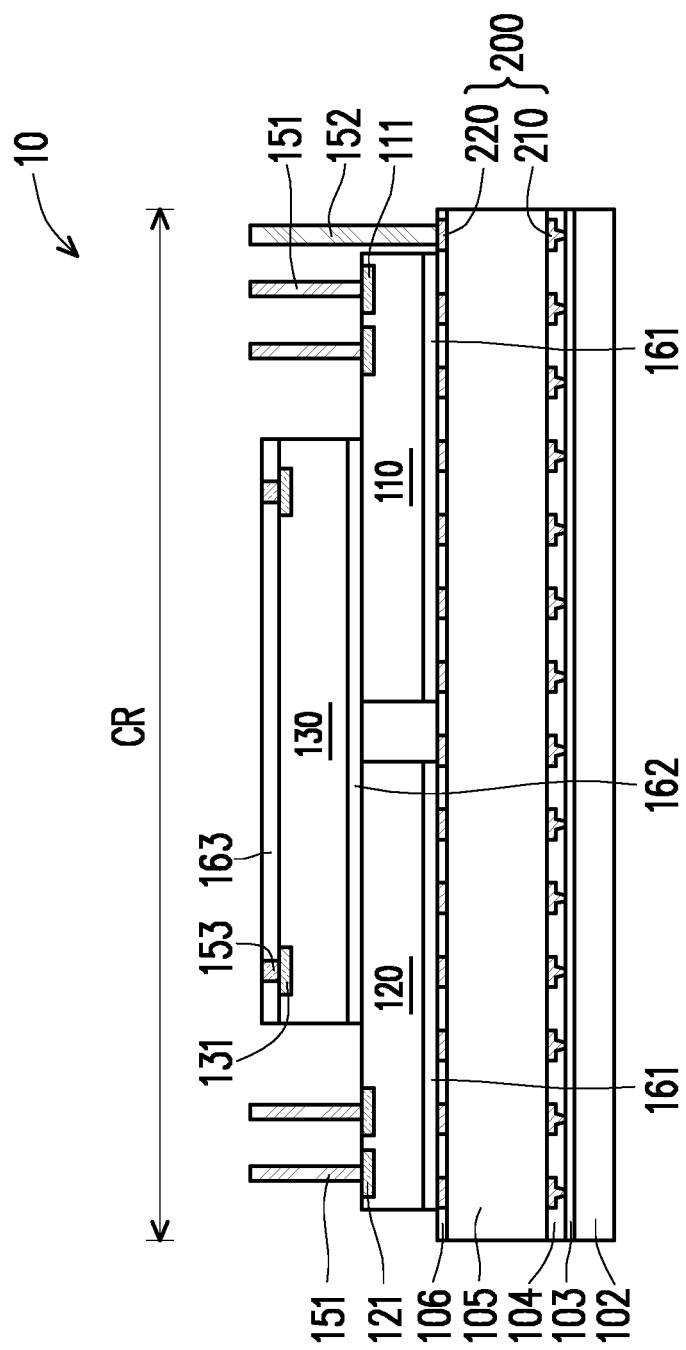

Referring to FIG. 3C, in some embodiments, one or more third dies 130 are provided. In some embodiments, the first die 110, the second die 120 and the third die 130 are disposed on the antenna 200 and over the carrier 102. In certain embodiments, the first die 110, the second die 120 and the third die 130 are disposed in the central region CR of the carrier 102 and are located above the antenna 200 and aside the second TIV 152. In some embodiments, the die attach films 161, 162 are provided between the first die 110, the second die 120 and the antenna 200 and between the third die 130 and the first and second dies 110, 120. In certain embodiments, as shown in FIG. 3C, the first die 110, the second die 120 and the third die 130 are front-to-back attached. In some embodiments, before the third die 130 is attached to the first die 110 and the second die 120, the first TIVs 151 are formed on and connected to the contacts 111, 121 of the first and second dies 110, 120.

In certain embodiments, as shown in FIG. 3C, the first die 110 is a 60 GHz radio frequency chip, the second die 120 is a 2.4 GHz radio frequency chip or a 5 GHz radio frequency chip or a combined 2.4 GHz/5 GHz radio frequency chip, and the third die 130 is a 60 GHz baseband chip. Due to the antenna and the dies of different types in the package structure 10 are stacked at different levels, the package structure 10 has small form factor and further has a much wider frequency range. In alternative embodiment, the first die 110 is a 60 GHz baseband chip, the second die 120 is a 2.4 GHz radio frequency chip or a 5 GHz radio frequency chip, or a combined 2.4 GHz/5 GHz radio frequency chip, and the third die 130 is a 60 GHz radio frequency chip. However, the disclosure is not limited thereto.

Figure 3D:
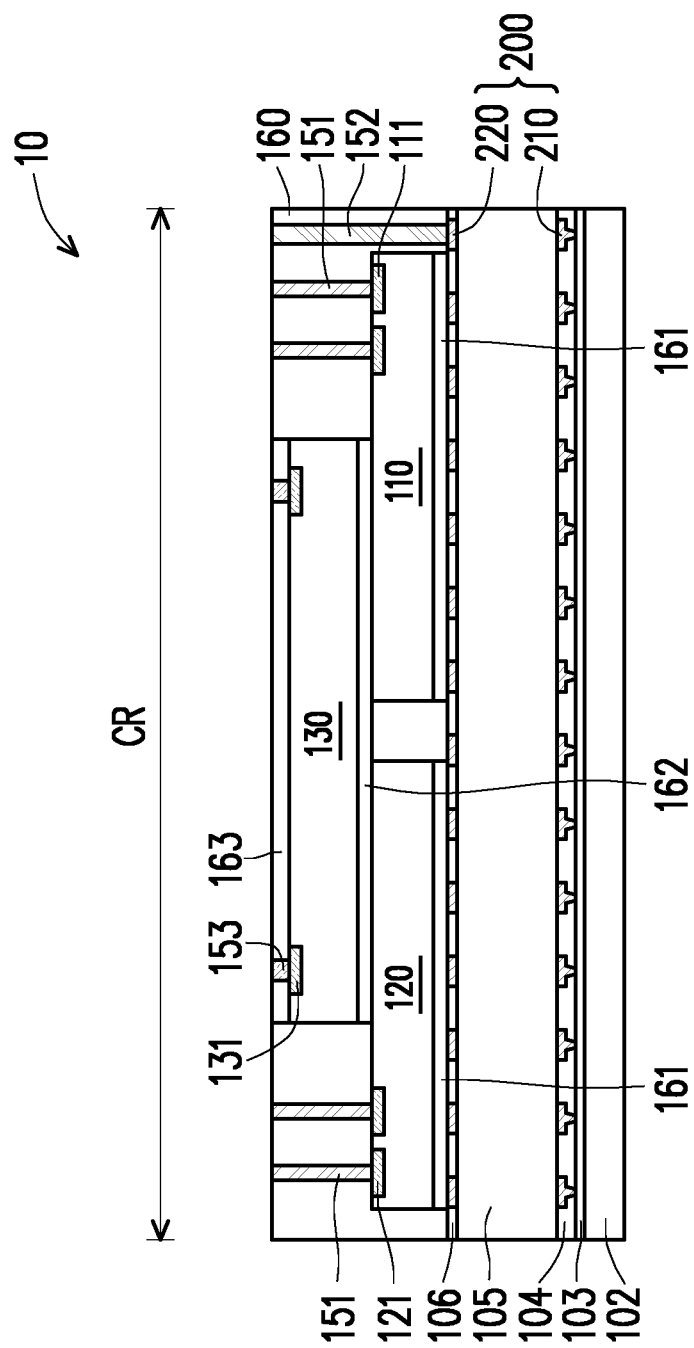

Referring to FIG. 3D, in some embodiments, the first die 110, the second die 120, the third die 130, the first TIVs 151, the second TIV 152 and the contacting posts 153 are encapsulated in a molding compound 160. In one embodiment, the molding compound 160 at least fills the space between the first die 110, the second die 120, the third die 130, the first TIVs 151 and the second TIV 152, and covers the antenna 200. In some embodiments, the molding compound 160 is planarized to expose top surfaces of the first TIVs 151, the second TIV 152, the contacting posts 153 and the protection layer 163. In certain embodiments, as shown in FIG. 3D, after the planarization, the first TIVs 151, the second TIV 152 and the molding compound 160 become substantially levelled. In one embodiment, the top surfaces of the first TIVs 151, the second TIV 152, the contacting posts 153, the molding compound 160 and the protection layer 163 are coplanar.

Figure 3E:
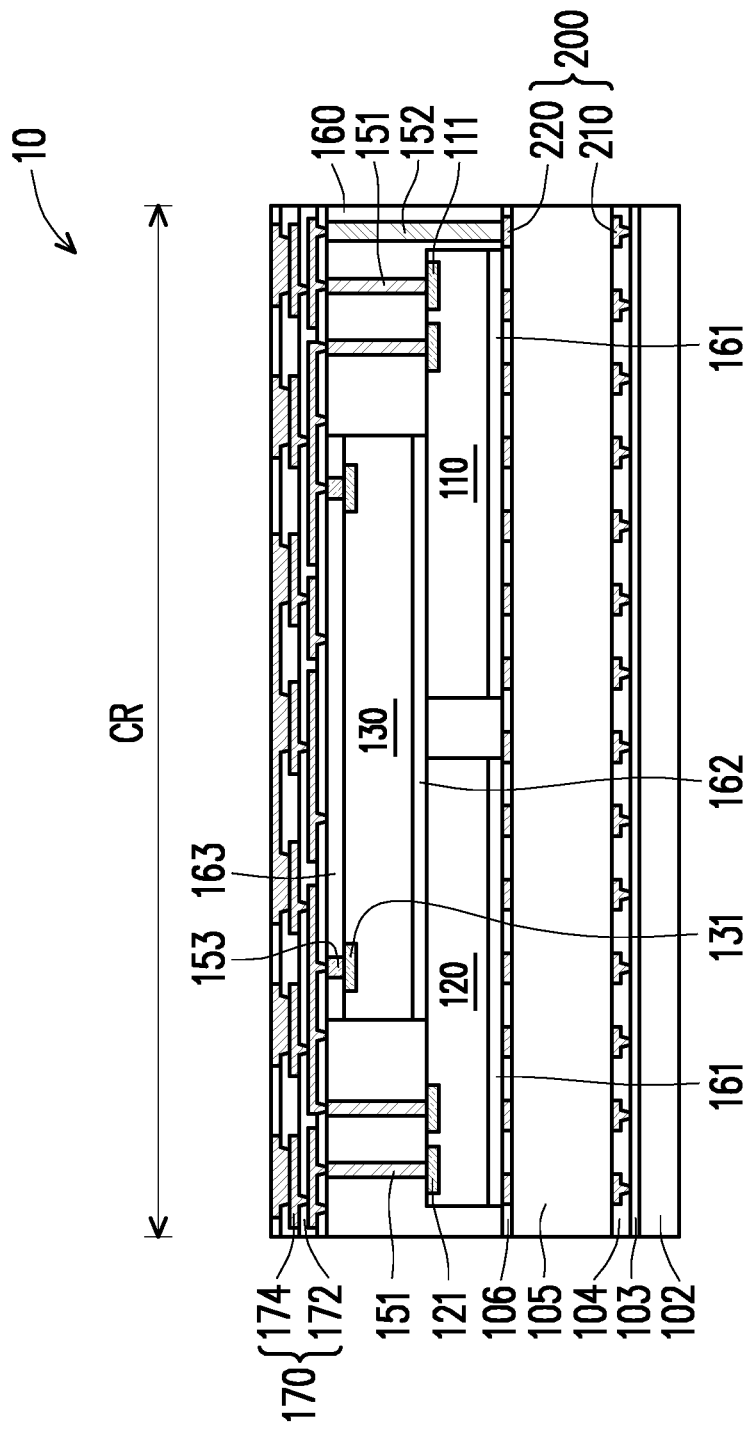

Referring to FIG. 3E, in some embodiments, the first redistribution layer 170 is formed on the molding compound 160, the first TIVs 151, the second TIV 152 and the third die 130. In some embodiments, the first redistribution layer 170 is electrically connected to the first die 110 and the second die 120 via the first TIVs 151, the third die 130 via the contacting posts 153, and is electrically connected to the antenna 200 via the second TIV 152. The formation of first redistribution layer 170 has been described in FIG. 1E and may not be repeated herein. In certain embodiments, the top surface of the topmost layer of the metallization layers 174 is exposed and the lowest layer of the metallization layers 174 is connected to the first TIVs 151, the second TIV 152 and the contacting posts 153.

In some embodiments, the antenna 200 is electrically connected to the first die 110, the second die 120 and the third die 130. Through the second TIV 152, the first redistribution layer 170, the first TIVs 151 and/or the contacting posts 153, electrical connection paths from the antenna 200 to the first die 110, the second die 120 and the third die 130 are established. In some embodiments, a distance of the electrical connection path between the first die 110 and the antenna 200 is smaller than or equal to a distance of the electrical connection path between the second die 120 and the antenna 200 and is smaller than or equal to a distance of the electrical connection path between the third die 130 and the antenna 200. With such specific distance condition, the package structure 10 has better electrical performance.

Figure 3F:
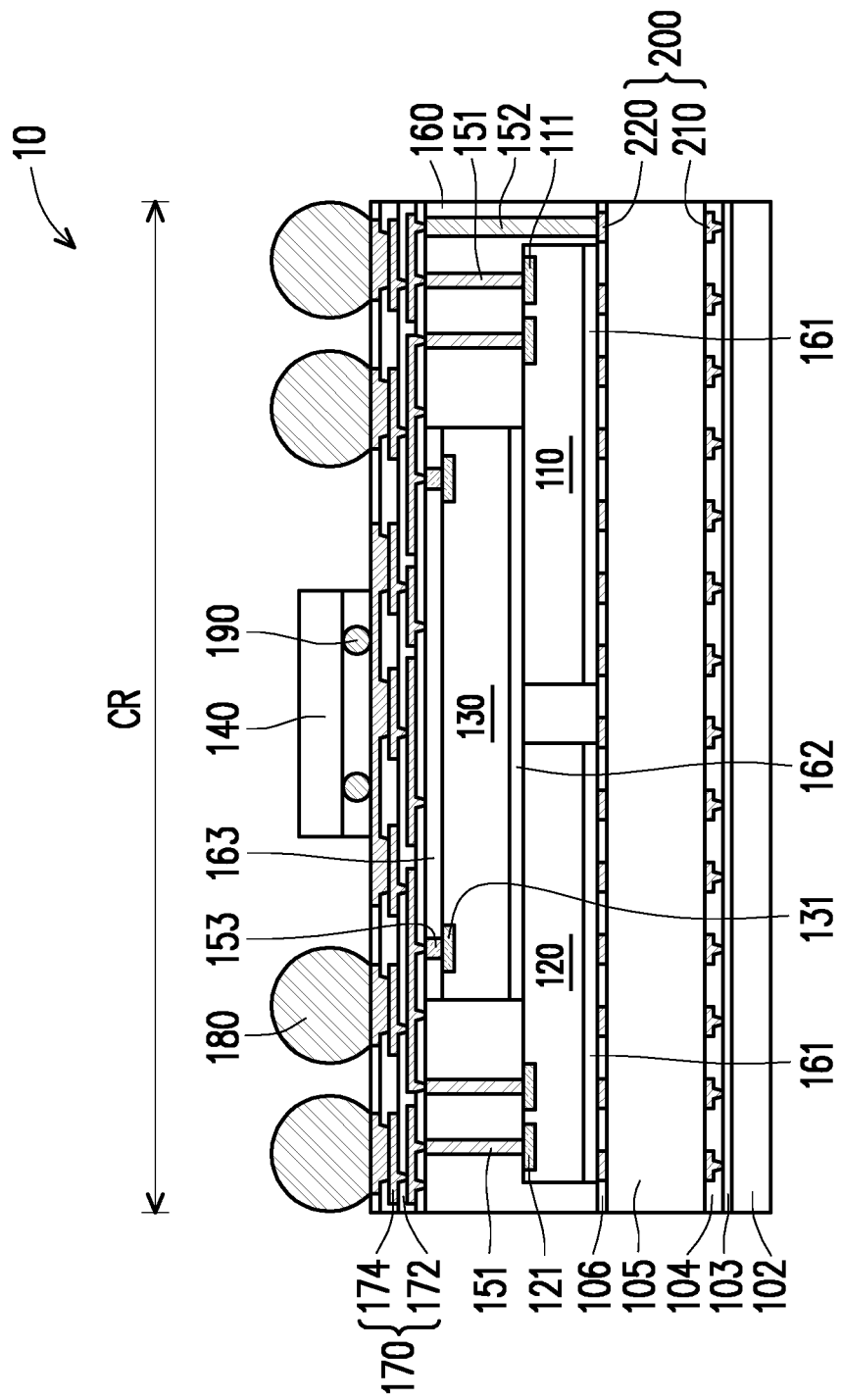

Referring to FIG. 3F, in some embodiments, the conductive elements 180 are disposed on the topmost metallization layer 174 of the first redistribution layer 170. In some embodiments, some of the conductive elements 180 are electrically connected to the first die 110 and the second die 120 through the first redistribution layer 170 and the first TIVs 151, some of the conductive elements 180 are electrically connected to the third die 130 through the first redistribution layer 170 and the contacting posts 153, and some of the conductive elements 180 are electrically connected to the antenna 200 through the second TIV 152 and the first redistribution layer 170. In some embodiments, the fourth die 140 is disposed on the top surface of the first redistribution layer 170 with connectors 190 there-between. In one embodiment, the fourth die 140 is joined to the first redistribution layer 170 after the conductive elements 180 are disposed. In some embodiments, the fourth die 140 is connected to the metallization layer 174 of the first redistribution layer 170 through flip chip bonding technology. In some embodiments, some of the conductive elements 180 and the fourth die 140 are electrically connected through the first redistribution layer 170. In some embodiments, the fourth die 140 may be electrically connected to the first die 110 and the second die 120 through the connectors 190, the first redistribution layer 170 and the first TIVs 151, the fourth die 140 may be electrically connected to the third die 130 through the connectors 190, the first redistribution layer 170 and the contacting post 153, and the fourth die 140 may be electrically connected to the antenna 200 through the connectors 190, the first redistribution layer 170 and the second TIV 152.

Figure 3G:
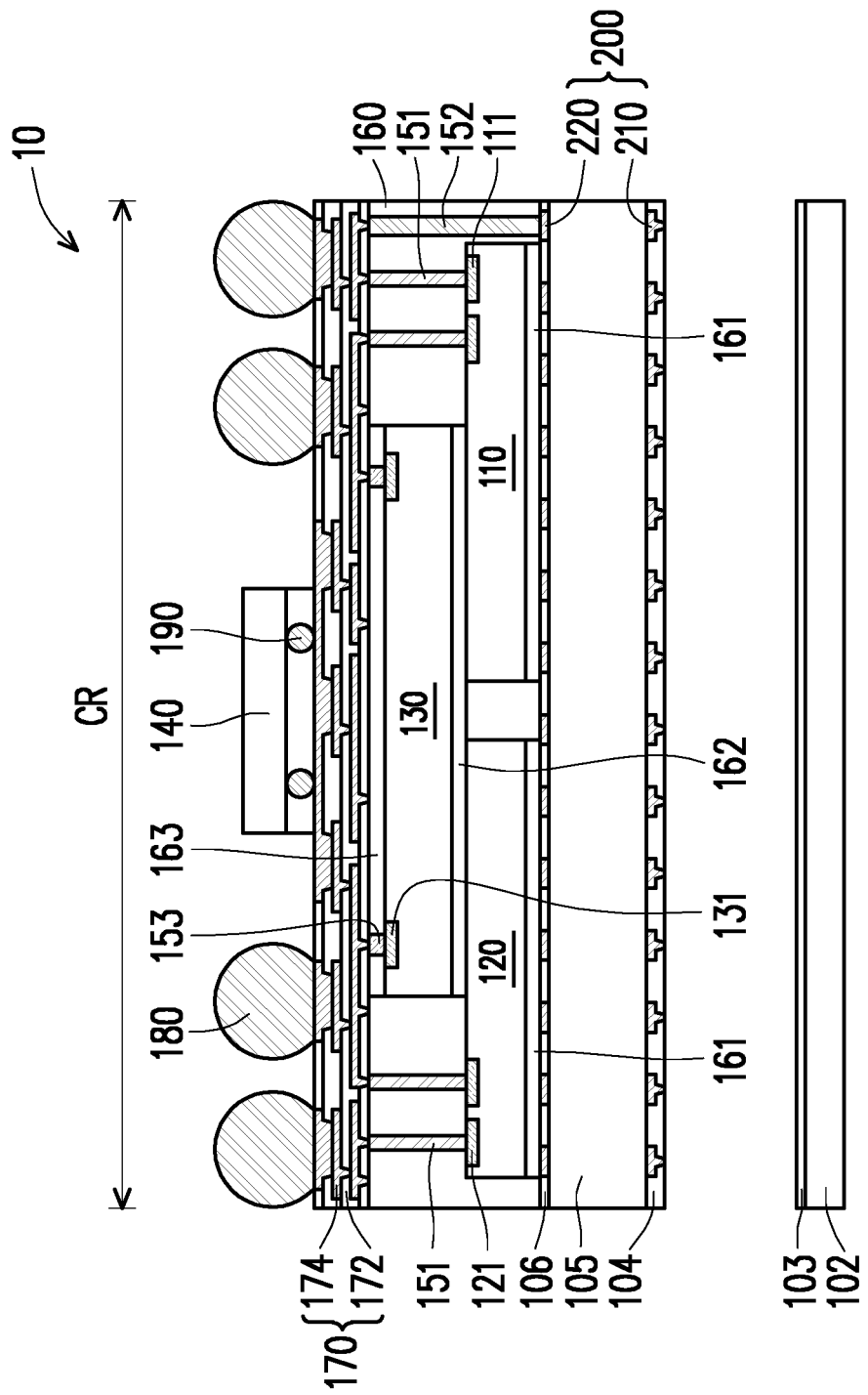

Referring to FIG. 3G, in some embodiments, the carrier 102 is debonded from the antenna 200 to form the package structure 10. The antenna 200 is easily separated from the carrier 102 due to the debond layer 103 of the carrier 102. In some embodiments, the dielectric layer 104 is debonded from the carrier 102, and the first metallic portion 210 of the antenna 200 may be exposed.

Figure 4:
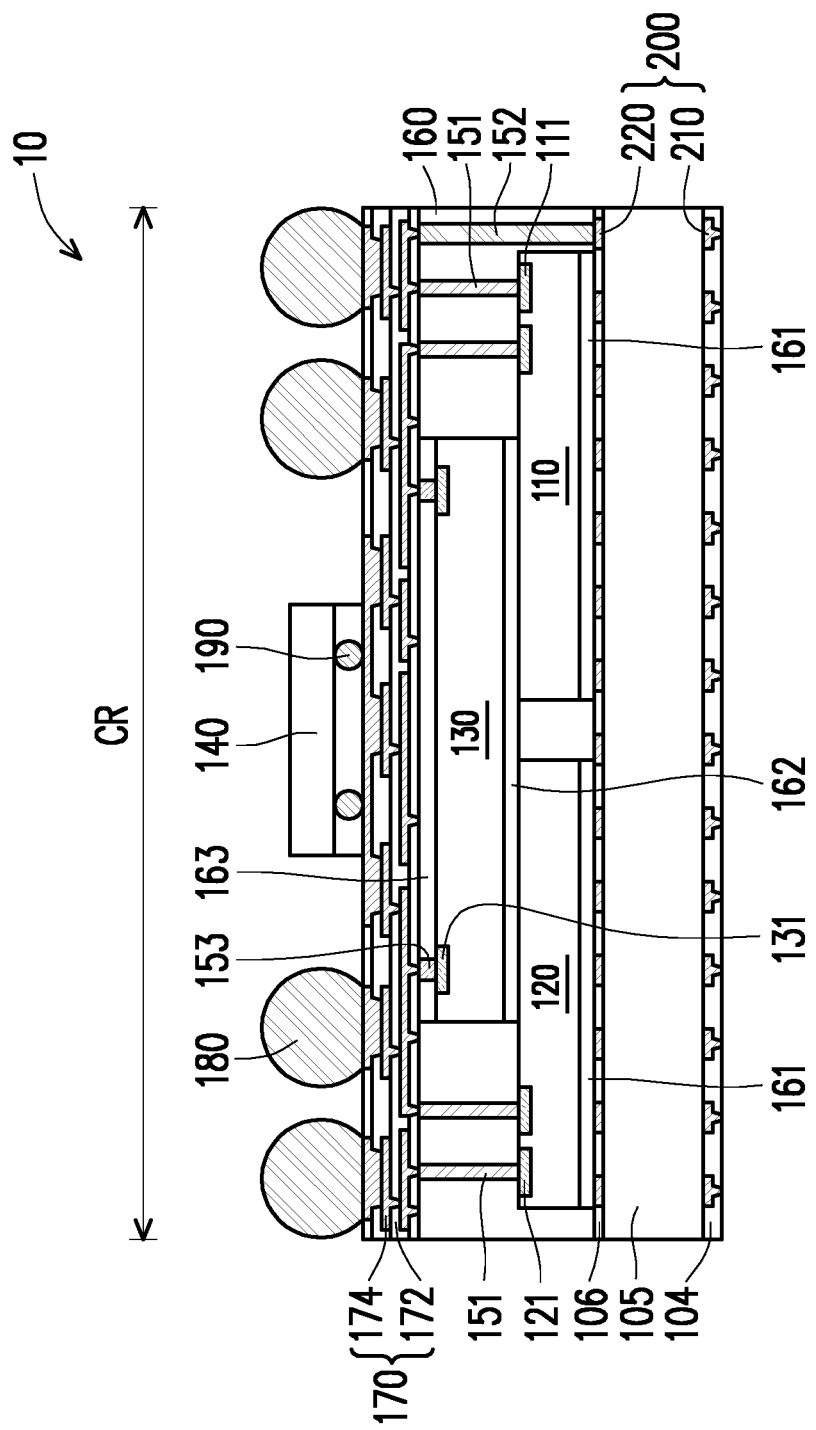
FIG. 4 is a schematic cross sectional view illustrating a package structure according to some exemplary embodiments of the present disclosure.

FIG. 4 is a schematic cross sectional view illustrating a package structure according to some exemplary embodiments. The package structure 10 of FIG. 4 may be fabricated following the previously described manufacturing process as described in FIG. 1A and FIG. 3A-3G. Referring to FIG. 4, in some embodiments, the package structure 10 includes the antenna 200, the first die 110, the second die 120, the third die 130, the molding compound 160, the first redistribution layer 170, the fourth die 140 and the conductive elements 180. In some embodiments, the first die 110 and the second die 120 are disposed on the antenna 200, the third die 130 is stacked over the first die 110 and the second die 120. In some embodiments, the first TIVs 151 are in direct contact with the contacts 111, 121 of the first die 110 and the second die 120, the second TIV 152 is in direct contact with the second metallic portion 220 of the antenna 200, and the contacting posts 153 located in the protection layer 163 are in direct contact with the contacts 131. In one embodiment, the first die 110, the second die 120, the third die 130, the first TIVs 151, the second TIV 152 and the contacting posts 153 are encapsulated by the molding compound 160, where the top surfaces of the first TIVs 151, the second TIV 152 and the contacting posts 153 are in contact with the first redistribution layer 170. In some embodiments, the first redistribution layer 170 is electrically connected to the first die 110, the second die 120 and the third die 130.

In some embodiments, the molding compound 160 is located between the antenna 200 and the first redistribution layer 170. In some embodiments, the fourth die 140 and the conductive elements 180 are disposed on the first redistribution layer 170, and the first redistribution layer 170 is located between the fourth die 140 and the molding compound 160 and between the conductive elements 180 and the molding compound 160. In some embodiments, the conductive elements 180 are electrically connected to the first redistribution layer 170 and is electrically connected to the first die 110, the second die 120, the third die 130 and/or the antenna 200 through the first redistribution layer 170, the first TIVs 151, the second TIV 152 and the contacting posts 153. In one embodiment, the fourth die 140 is electrically connected to the first redistribution layer 170 through the connectors 190.

In certain embodiments, as shown in FIG. 4, the first die 110 is a 60 GHz radio frequency chip, the second die 120 is a 2.4 GHz radio frequency chip or a 5 GHz radio frequency chip, or a combined 2.4 GHz/5 GHz radio frequency chip, and the third die 130 is a 60 GHz baseband chip. Accordingly, due to the dies of different types in the package structure 10 are stacked at different levels, the package structure 10 has small form factor and further has a much wider frequency range. In one alternative embodiment, the first die 110 is a 60 GHz baseband chip, the second die 120 is a 2.4 GHz radio frequency chip or a 5 GHz radio frequency chip, or a combined 2.4 GHz/5 GHz radio frequency chip, and the third die 130 is a 60 GHz radio frequency chip. However, the disclosure is not limited thereto.

In one embodiment, the antenna 200 is below the molding compound 160. In some embodiments, a distance of the electrical connection path between the first die 110 and the antenna 200 is smaller than or equal to a distance of the electrical connection path between the second die 120 and the antenna 200 and is smaller than or equal to a distance of the electrical connection path between the third die 130 and the antenna 200. With such specific distance condition, the package structure 10 has better electrical performance.

FIG. 5A to FIG. 5E are schematic cross sectional views of various stages in a manufacturing method of a package structure according to some exemplary embodiments of the present disclosure. The elements similar to or substantially the same as the elements described previously will use the same reference numbers, and certain details or descriptions of the same elements may not be repeated herein.

Referring in FIG. 5A, in some embodiments, the second redistribution layer 270 is sequentially formed on the antenna 200 and over the carrier 102, following the process as described in FIG. 3A. In some embodiments, the second redistribution layer 270 is electrically connected to the antenna 200. The formation of the second redistribution layer 270 includes sequentially forming one or more polymer dielectric layers 272 and one or more metallization layers 274 in alternation. The materials of the second redistribution layer 270 and the formation methods similar to the processes for forming the first redistribution layer 170 as described in FIG. 1E may not be repeated herein. In certain embodiments, the top surface of the topmost layer of the metallization layer 274 is exposed and the lowest layer of the metallization layer 274 is directly connected to the second metallic portion 220 of the antenna 200. In some embodiments, the second through interlayer vias (TIVs) 152 are disposed on the topmost layer of the metallization layer 274 of the second redistribution layer 270, and the second TIVs 152 are directly connected to the antenna 200 through the second redistribution layer 270. In some embodiments, the second TIVs 152 are a through integrated fan-out (InFO) via.

Referring in FIG. 5B, in some embodiments, one or more third dies 130 are provided. In some embodiments, the first die 110, the second die 120 and the third die 130 are disposed on the second redistribution layer 270 and over the carrier 102. In certain embodiments, the first die 110, the second die 120 and the third die 130 are located above the antenna 200 and aside the second TIVs 152. In some embodiments, the top surface of the first die 110 is attached to the second redistribution layer 270, wherein the first die 110 is attached to the second redistribution layer 270 with the contacting posts 153 through flip chip bonding technology (an underfill layer not shown). In some embodiments, the die attach film 161 is provided between the second die 120, the third die 130 and the second redistribution layer 270. In certain embodiments, as shown in FIG. 5B, the first die 110, the second die 120 and the third die 130 are arranged side-by-side. In some embodiments, the second die 120 and third die 130 are provided with the protection layer 163 covering top surfaces of the second die 120 and the third die 130 with openings exposing contacts 121, 131 and contacting posts 153 filled in the openings and located on the contacts 121, 131.

In certain embodiments, as shown in FIG. 5B, the first die 110 is a 60 GHz radio frequency chip, the second die 120 is a 2.4 GHz radio frequency chip or a 5 GHz radio frequency chip, or a combined 2.4 GHz/5 GHz radio frequency chip, and the third die 130 is a 60 GHz baseband chip. Due to the antenna and the dies of different types in the package structure 10 are stacked at different levels, the package structure 10 has small form factor and further has a much wider frequency range. In alternative embodiment, the first die 110 is a 60 GHz radio frequency chip, the second die 120 is a 60 GHz baseband chip, and the third die 130 is a 2.4 GHz radio frequency chip or a 5 GHz radio frequency chip, or a combined 2.4 GHz/5 GHz radio frequency chip. However, the disclosure is not limited thereto.

Referring to FIG. 5B, in some embodiments, the first die 110, the second die 120, the third die 130, the second TIVs 152 and the contacting posts 153 are molded and encapsulated in a molding compound 160. In one embodiment, the molding compound 160 at least fills the space between the first die 110, the second die 120, the third die 130 and the second TIVs 152, and covers the second redistribution layer 270 and the antenna 200. In some embodiments, the molding compound 160 is planarized to expose top surfaces of the second TIVs 152, the contacting posts 153, and the protection layer 163. In certain embodiments, as shown in FIG. 5B, after the planarization, top surfaces of the second TIVs 152 and the molding compound 160 become substantially levelled. In one embodiment, the top surfaces of the second TIVs 152, the contacting posts 153, the molding compound 160 and the protection layer 163 are coplanar.

Figure 5C:
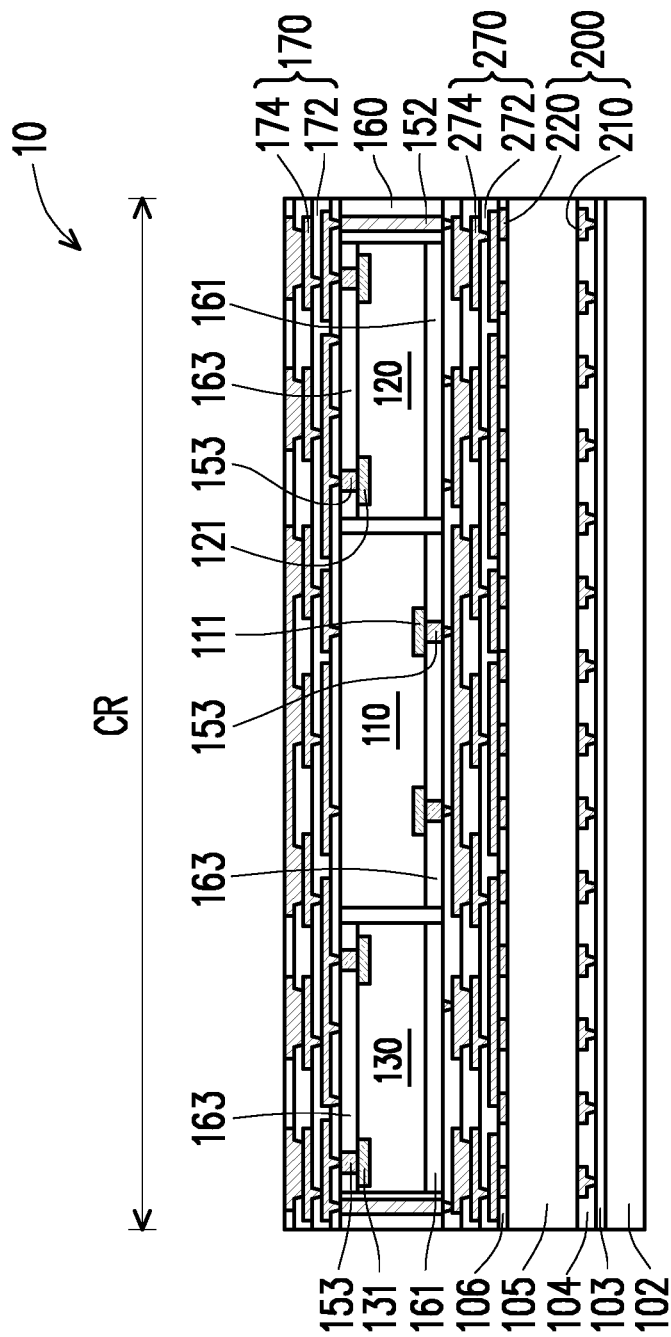

Referring to FIG. 5C, in some embodiments, the first redistribution layer 170 is formed on the molding compound 160, the second TIVs 152, the first die 110, the second 120 and the third die 130. In some embodiments, the first redistribution layer 170 is electrically connected to the first die 110 and the antenna 200 via the second redistribution layer 270, the second TIVs 152 and/or the contacting posts 153, and the first redistribution layer 170 is electrically connected to the second die 120 and the third die 130 via the contacting posts 153. The formation of the first redistribution layer 170 has been described in FIG. 1E and may not be repeated herein. In certain embodiments, the top surface of the topmost layer of the metallization layers 174 is exposed and the lowest layer of the metallization layers 174 is connected to the second TIVs 152 and the contacting posts 153 of the second die 120 and the third die 130.

In some embodiments, the antenna 200 is electrically connected to the first die 110, the second die 120 and the third die 130. In certain embodiments, the antenna 200 is electrically connected to the first die 110 through the second redistribution layer 270 and the contacting posts 153 and electrically connected to the second die 120 and the third die 130 through the second redistribution layer 270, the second TIVs 152, the first redistribution layer 170 and the contacting posts 153, electrical connection paths from the antenna 200 to the first die 110, the second die 120 and the third die 130 are established. In some embodiments, a distance of the electrical connection path between the first die 110 and the antenna 200 is smaller than or equal to a distance of the electrical connection path between the second die 120 and the antenna 200 and is smaller than or equal to a distance of the electrical connection path between the third die 130 and the antenna 200. With such specific distance condition, the package structure 10 has better electrical performance.

Figure 5D:
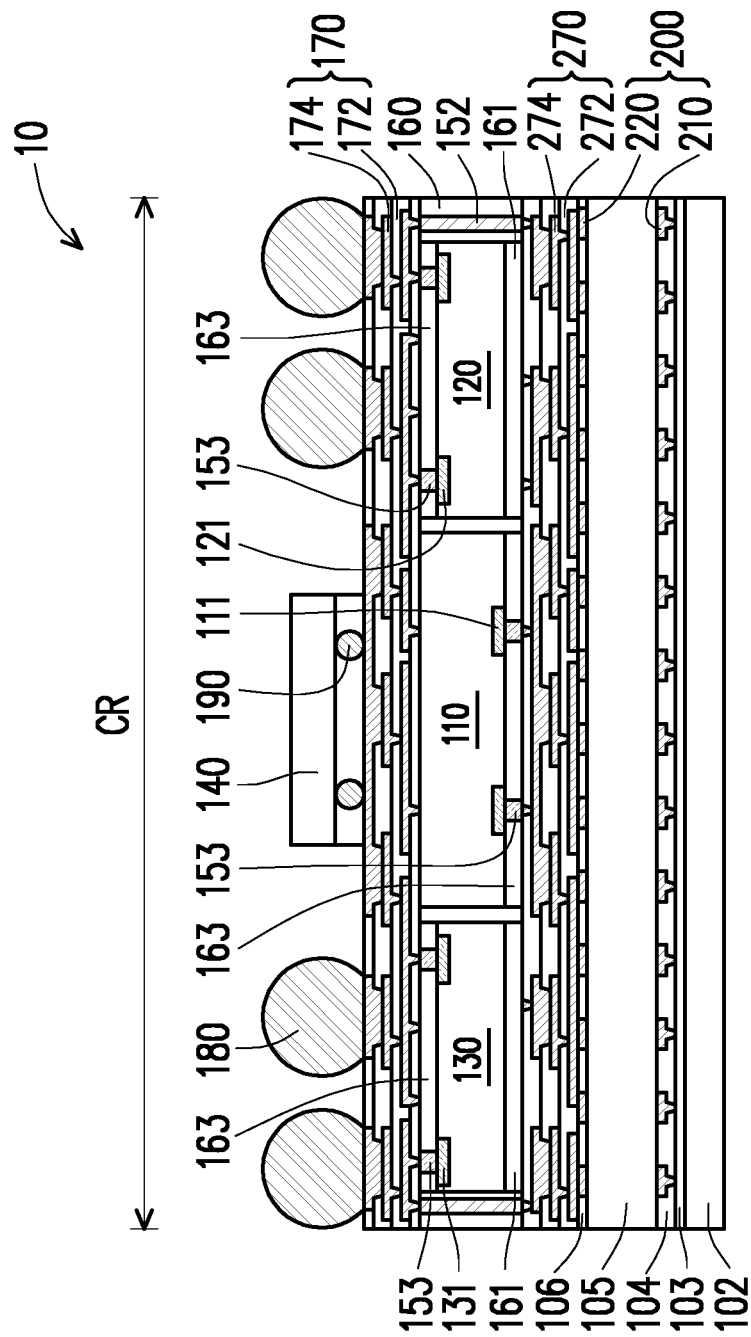

Referring to FIG. 5D, in some embodiments, the conductive elements 180 are disposed on the topmost layer of the metallization layers 174 of the first redistribution layer 170. In some embodiments, some of the conductive elements 180 are electrically connected to the first die 110 and the antenna 200 through the first redistribution layer 170, the second TIVs 152, the second redistribution layer 270 and/or the contacting posts 153. In some embodiments, some of the conductive elements 180 are electrically connected to the second die 120 and the third die 130 through the first redistribution layer 170 and the contacting posts 153.

In one embodiment, the fourth die 140 is joined to the first redistribution layer 170 after the conductive elements 180 are disposed. In some embodiments, the fourth die 140 is connected to the topmost layer of the metallization layers 174 of the first redistribution layer 170 with connectors 190 there-between through flip chip bonding technology. In some embodiments, the fourth die 140 may be electrically connected to the first die 110 and the antenna 200 through the connectors 190, the first redistribution layer 170, the second TIVs 152, the second redistribution layer 270 and/or the contacting posts 153 and may be electrically connected to the second die 120 and the third die 130 through the connectors 190, the first redistribution layer 170 and the contacting post 153. In some embodiments, some of the conductive elements 180 and the fourth die 140 are electrically connected through the first redistribution layer 170.

Figure 5E:
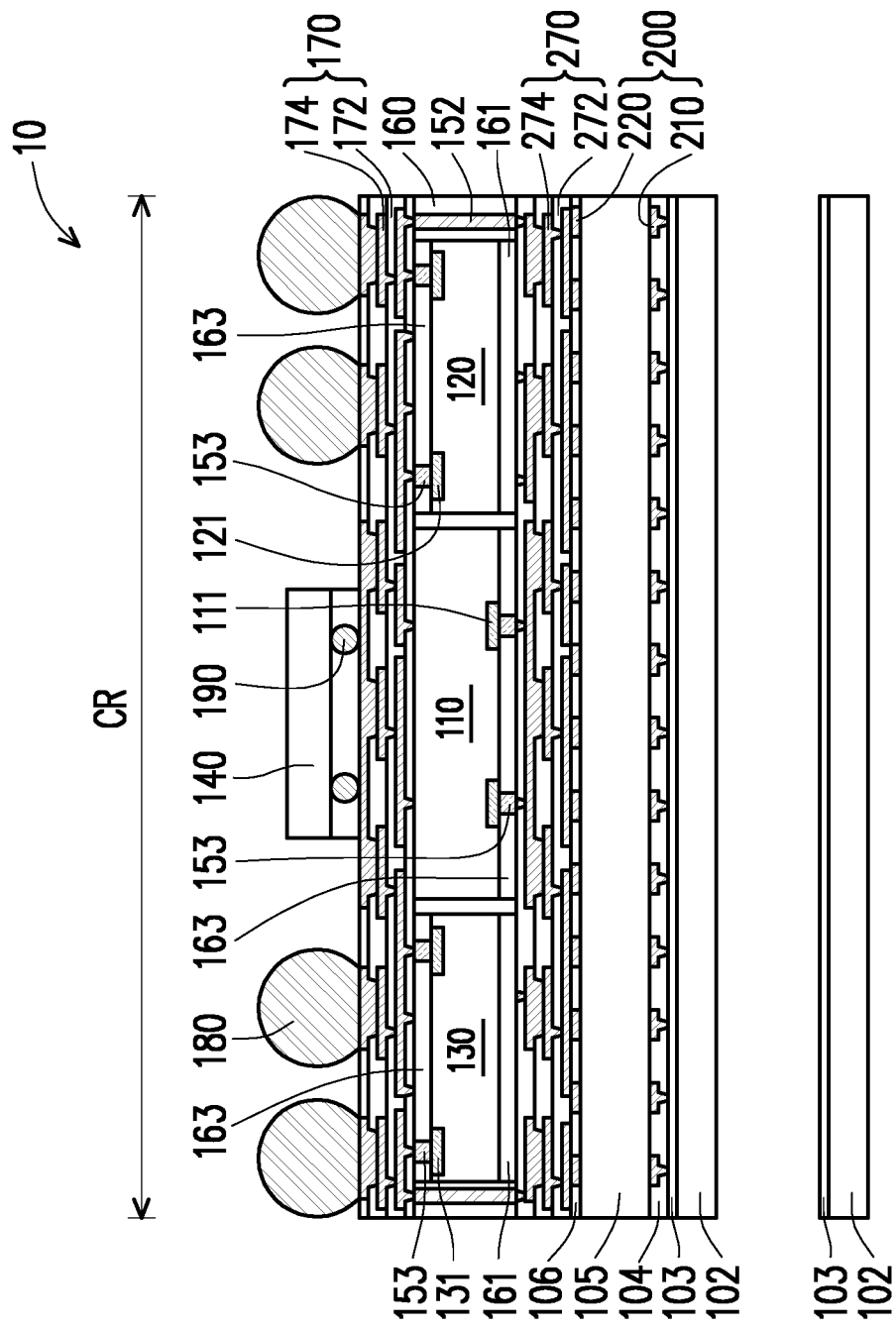

Referring to FIG. 5E, in some embodiments, the carrier 102 is debonded from the antenna 200 to form the package structure 10. The antenna 200 is easily separated from the carrier 102 due to the debond layer 103 of the carrier 102. In some embodiments, the dielectric layer 104 is debonded from the carrier 102, and the first metallic portion 210 of the antenna 200 may be exposed.

Figure 6:
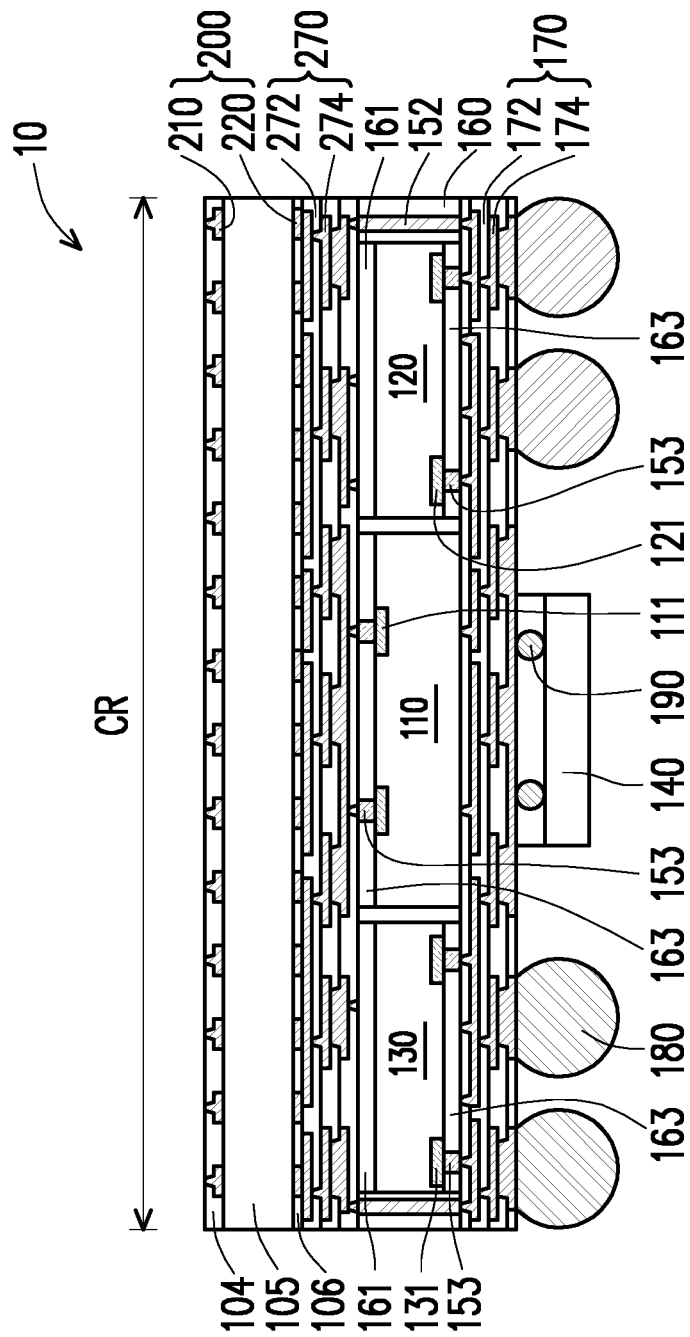
FIG. 6 is a schematic cross sectional view illustrating a package structure according to some exemplary embodiments of the present disclosure.

FIG. 6 is a schematic cross sectional view illustrating a package structure according to some exemplary embodiments. The package structure 10 of FIG. 6 may be fabricated following the previously described manufacturing process as described in FIG. 3A and FIG. 5A-5E. Referring to FIG. 6, in some embodiments, the package structure 10 includes the antenna 200, the second redistribution layer 270, the first die 110, the second die 120, the third die 130, the molding compound 160, the first redistribution layer 170, the fourth die 140 and the conductive elements 180. In some embodiments, the second redistribution layer 270 is disposed on the antenna 200, and the first die 110, the second die 120 and the third die 130 are disposed on the second redistribution layer 270. In certain embodiments, the first die 110, the second die 120 and the third die 130 are arranged side-by-side, which reduces the thickness of the package structure 10. In some embodiments, the second TIVs 152 are in direct contact with the first redistribution layer 170 and the second redistribution layer 270 and are located there-between. The contacting posts 153 on the first die are in direct contact with the contacts 111 of the first die 110 for flip chip bonding to the second redistribution layer 270. The contacting posts 153 located in the protection layers 163 disposed on the second die 120 and the third die 130 are in direct contact with the contacts 121, 131. In some embodiments, the first die 110, the second die 120, the third die 130, the second TIVs 152 and the contacting posts 153 are encapsulated by the molding compound 160, where the top surfaces of the second TIVs 152 and the contacting posts 153 are in contact with the first redistribution layer 170. In some embodiments, the first redistribution layer 170 is electrically connected to the first die 110, the second die 120 and the third die 130.

In some embodiments, the molding compound 160 is located between the antenna 200 and the first redistribution layer 170 and between the second redistribution layer 270 and the first redistribution layer 170. In some embodiments, the fourth die 140 and the conductive elements 180 are disposed on the first redistribution layer 170, and the first redistribution layer 170 is located between the fourth die 140 and the molding compound 160 and between the conductive elements 180 and the molding compound 160. In some embodiments, the conductive elements 180 are electrically connected to the first redistribution layer 170 and electrically connected to the first die 110, the second die 120, the third die 130 and/or the antenna 200 through the first redistribution layer 170, the second TIVs 152, the second redistribution layer 270 and the contacting posts 153. In one embodiment, the fourth die 140 is electrically connected to the first redistribution layer 170 through the connectors 190.

In certain embodiments, as shown in FIG. 6, the first die 110 is a 60 GHz radio frequency chip, the second die 120 is a 2.4 GHz radio frequency chip or a 5 GHz radio frequency chip, or a combined 2.4 GHz/5 GHz radio frequency chip, and the third die 130 is a 60 GHz baseband chip. Accordingly, due to the dies of different types in the package structure 10 are stacked at different levels, the package structure 10 has small form factor and further has a much wider frequency range. In one alternative embodiment, the first die 110 is a 60 GHz radio frequency chip, the second die 120 is a 60 GHz baseband chip, and the third die 130 is a 2.4 GHz radio frequency chip or a 5 GHz radio frequency chip, or a combined 2.4 GHz/5 GHz radio frequency chip. However, the disclosure is not limited thereto.

In one embodiment, the antenna 200 is right above the molding compound 160. In some embodiments, a distance of the electrical connection path between the first die 110 and the antenna 200 is smaller than or equal to a distance of the electrical connection path between the second die 120 and the antenna 200 and is smaller than or equal to a distance of the electrical connection path between the third die 130 and the antenna 200. With such specific distance condition, the package structure 10 has better electrical performance.

FIG. 7A to FIG. 7D are schematic cross sectional views of various stages in a manufacturing method of a package structure according to some exemplary embodiments of the present disclosure. The elements similar to or substantially the same as the elements described previously will use the same reference numbers, and certain details or descriptions of the same elements may not be repeated herein.

Figure 7A:
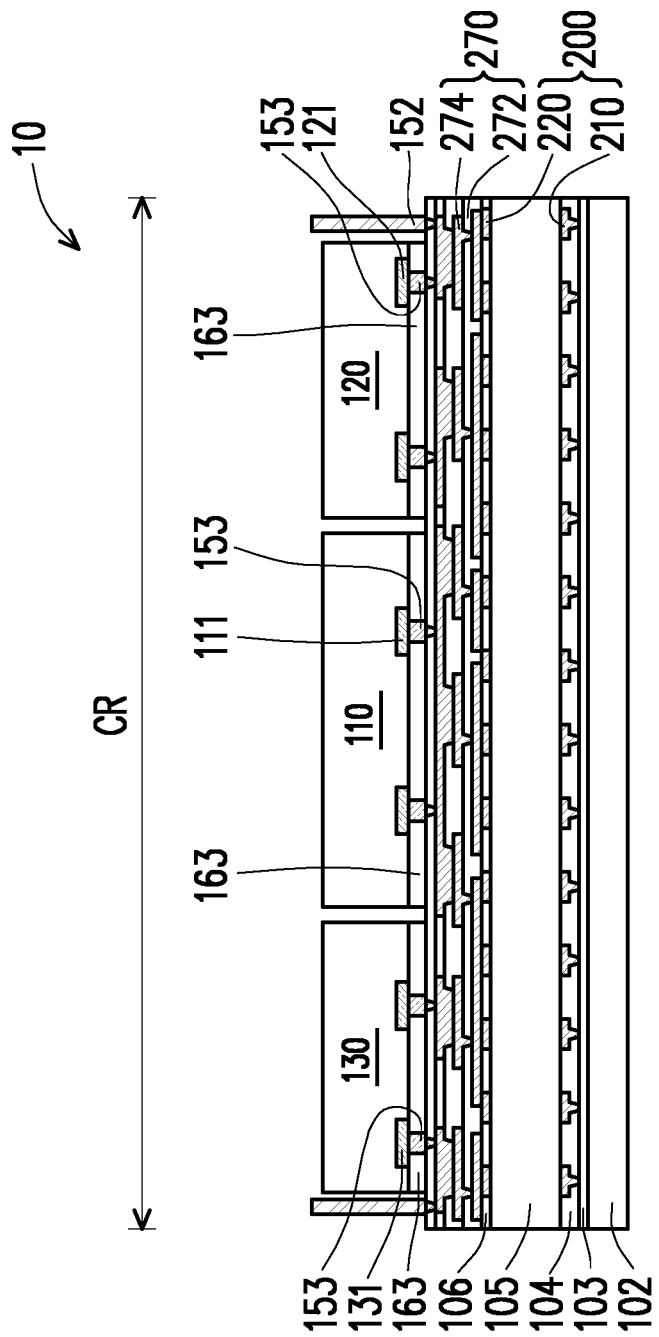
FIG. 7A to FIG. 7E are schematic cross sectional views of various stages in a manufacturing method of a package structure according to some exemplary embodiments of the present disclosure.

Referring in FIG. 7A, in some embodiments, one or more third dies 130 are provided. In some embodiments, the first die 110, the second die 120 and the third die 130 are disposed on the second redistribution layer 270 and over the carrier 102 through flip clip bonding, following the process as described in FIG. 5A. In certain embodiments, the first die 110, the second die 120 and the third die 130 are located above the antenna 200 and aside the second TIVs 152. In some embodiments, the top surface of the first die 110, the second die 120 and the third die 130 are attached to the second redistribution layer 270 with the contacting posts 153 through flip chip bonding technology. In certain embodiments, as shown in FIG. 7A, the first die 110, the second die 120 and the third die 130 are arranged side-by-side. In some embodiments, the contacting posts 153 are in direct contact with the contacts 111, 121, 131 of the first die 110, the second die 120 and the third die 130, respectively, for flip chip bonding to the second redistribution layer 270. In certain embodiments, the first die 110, the second die 120 and the third die 130 are electrically connected to the second redistribution layer 270 through the contacting posts 153.

In certain embodiments, as shown in FIG. 7A, the first die 110 is a 60 GHz radio frequency chip, the second die 120 is a 2.4 GHz radio frequency chip or a 5 GHz radio frequency chip, or a combined 2.4 GHz/5 GHz radio frequency chip, and the third die 130 is a 60 GHz baseband chip. Due to the antenna and the dies of different types in the package structure 10 are stacked at different levels, the package structure 10 has small form factor and further has a much wider frequency range. In alternative embodiment, the first die 110 is a 60 GHz radio frequency chip, the second die 120 is a 60 GHz baseband chip, and the third die 130 is a 2.4 GHz radio frequency chip or a 5 GHz radio frequency chip, or a combined 2.4 GHz/5 GHz radio frequency chip. However, the disclosure is not limited thereto.

Figure 7B:
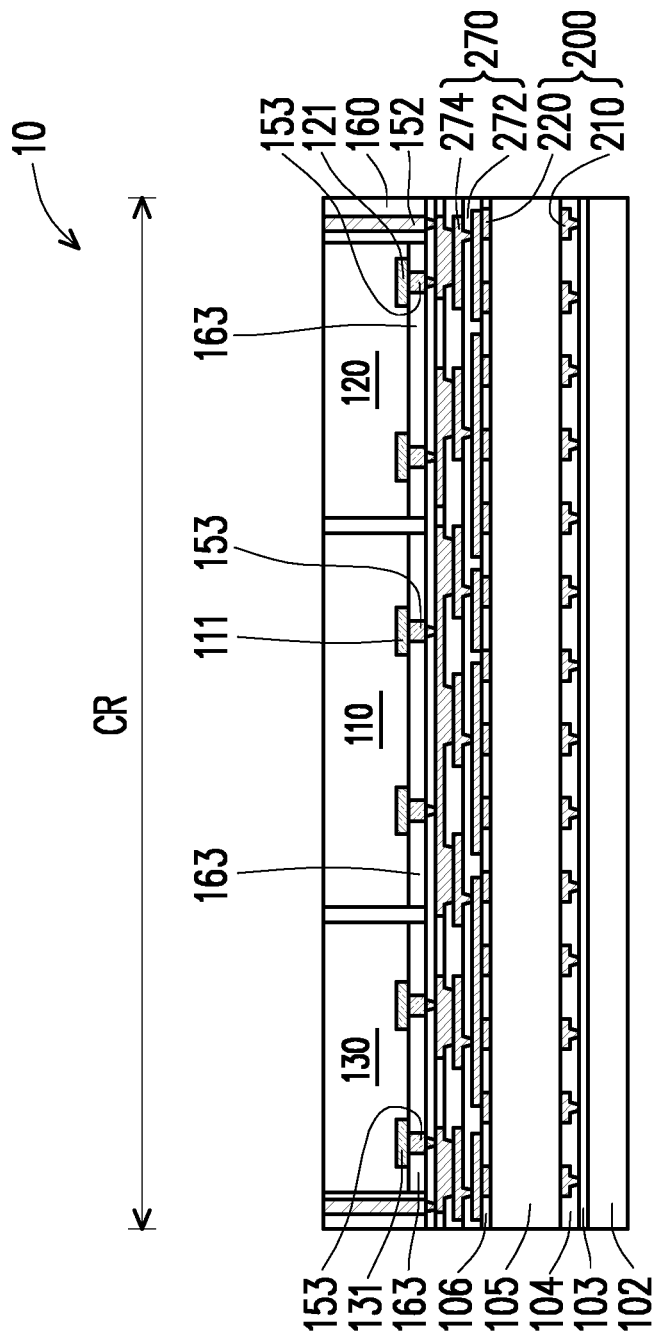

Referring to FIG. 7B, in some embodiments, the first die 110, the second die 120, the third die 130, the second TIVs 152 and the contacting posts 153 are molded and encapsulated in a molding compound 160. In one embodiment, the molding compound 160 at least fills the space between the first die 110, the second die 120, the third die 130 and the second TIVs 152, and covers the second redistribution layer 270 and the antenna 200. In some embodiments, the molding compound 160 is planarized to expose top surfaces of the second TIVs 152. In certain embodiments, as shown in FIG. 7B, after the planarization, top surfaces of the second TIVs 152 and the molding compound 160 become substantially levelled. In one embodiment, the top surfaces of the second TIVs 152, the back surfaces of the first die 110, the second die 120 and the third die 130 and the molding compound 160 are coplanar.

Figure 7C:
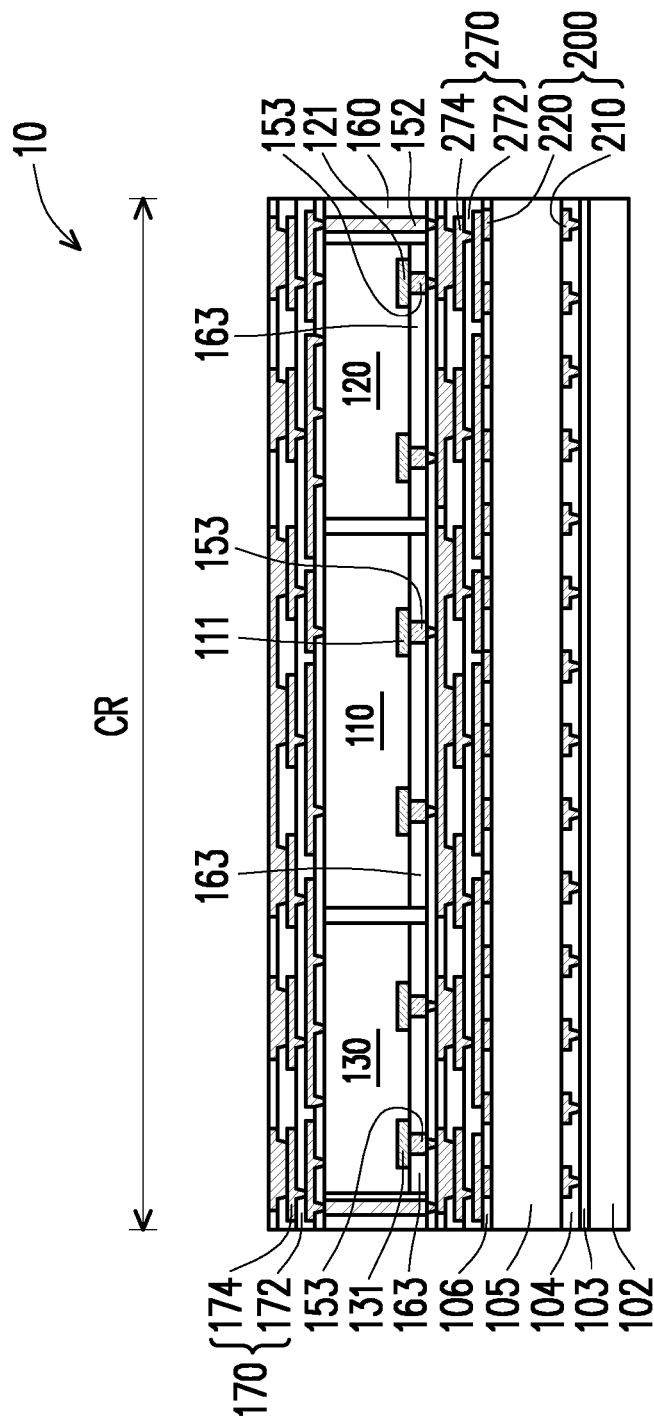

Referring to FIG. 7C, in some embodiments, the first redistribution layer 170 is formed on the molding compound 160, the second TIVs 152, and the back surfaces of the first die 110, the second 120 and the third die 130. In some embodiments, the first redistribution layer 170 is electrically connected to the first die 110, the second die 120 and the third die 130 via the second TIVs 152, the second redistribution layer 270 and the contacting posts 153. In some embodiments, the first redistribution layer 170 is electrically connected to the antenna 200 via the second TIVs 152 and the second redistribution layer 270. The formation of the first redistribution layer 170 has been described in FIG. 1E and may not be repeated herein. In certain embodiments, as shown in FIG. 7C, the metallization layers 174 are sandwiched between the polymer dielectric layers 172, but the top surface of the topmost layer of the metallization layers 174 is exposed and the lowest layer of the metallization layers 174 is connected to the second TIVs 152 and the back surfaces of the first die 110, the second die 120 and the third die 130.

In some embodiments, the antenna 200 is electrically connected to the first die 110, the second die 120 and the third die 130 through the second TIVs 152, the second redistribution layer 270 and the contacting posts 153, electrical connection paths from the antenna 200 to the first die 110, the second die 120 and the third die 130 are established. In some embodiments, a distance of the electrical connection path between the first die 110 and the antenna 200 is smaller than or equal to a distance of the electrical connection path between the second die 120 and the antenna 200 and is smaller than or equal to a distance of the electrical connection path between the third die 130 and the antenna 200. With such specific distance condition, the package structure 10 has better electrical performance.

Figure 7D:
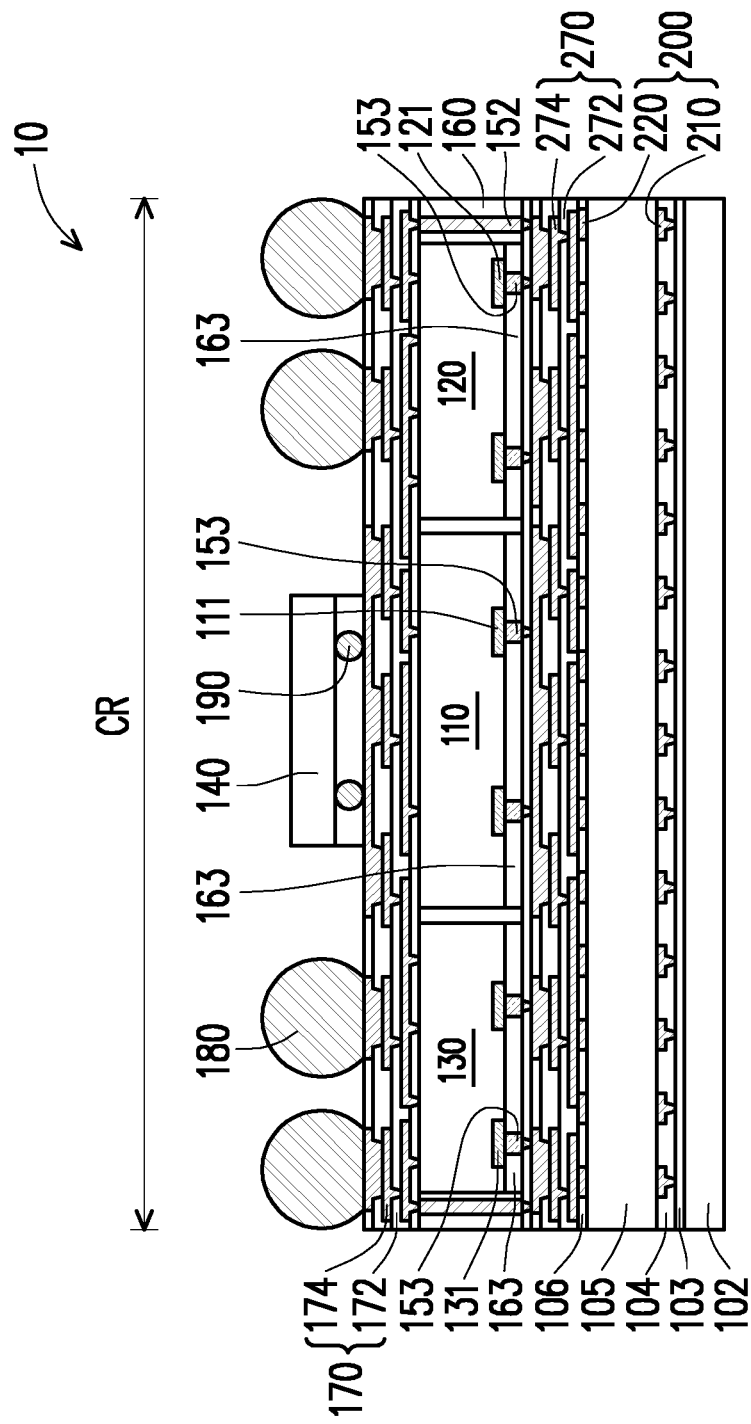

Referring to FIG. 7D, in some embodiments, the conductive elements 180 are disposed on the topmost layer of the metallization layers 174 of the first redistribution layer 170. In some embodiments, some of the conductive elements 180 are electrically connected to the first die 110, the second die 120 and the third die 130 through the first redistribution layer 170, the second TIVs 152, the second redistribution layer 270 and the contacting posts 153. In some embodiments, some of the conductive elements 180 are electrically connected to the antenna 200 through the first redistribution layer 170, the second TIVs 152 and the second redistribution layer 270.

In one embodiment, the fourth die 140 is joined to the first redistribution layer 170 after the conductive elements 180 are disposed. In some embodiments, the fourth die 140 is disposed on the top surface of the first redistribution layer 170 with connectors 190 there-between. In some embodiments, the fourth die 140 is connected to the first redistribution layer 170 through flip chip bonding technology. In some embodiments, the fourth die 140 may be electrically connected to the first die 110, the second die 120 and the third die 130 through the first redistribution layer 170, the second TIVs 152, the second redistribution layer 270 and the contacting posts 153 and may be electrically connected to the antenna 200 through the first redistribution layer 170, the second TIVs 152 and the second redistribution layer 270. In some embodiments, some of the conductive elements 180 and the fourth die 140 are electrically connected through the first redistribution layer 170.

Figure 7E:
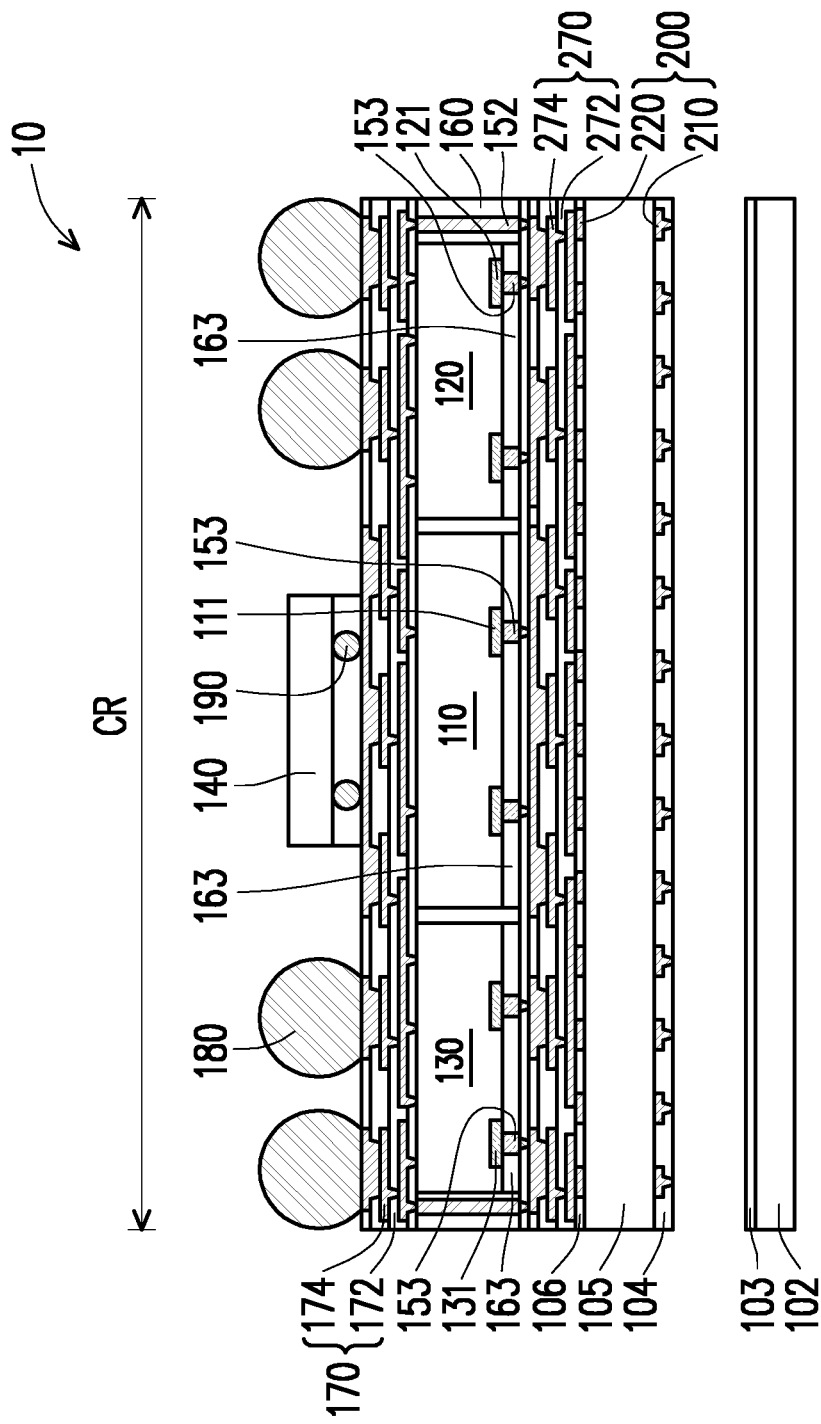

Referring to FIG. 7E, in some embodiments, the carrier 102 is debonded from the antenna 200 to form the package structure 10. The antenna 200 is easily separated from the carrier 102 due to the debond layer 103 of the carrier 102. In some embodiments, the dielectric layer 104 is debonded from the carrier 102, and the first metallic portion 210 of the antenna 200 may be exposed.

Figure 8:
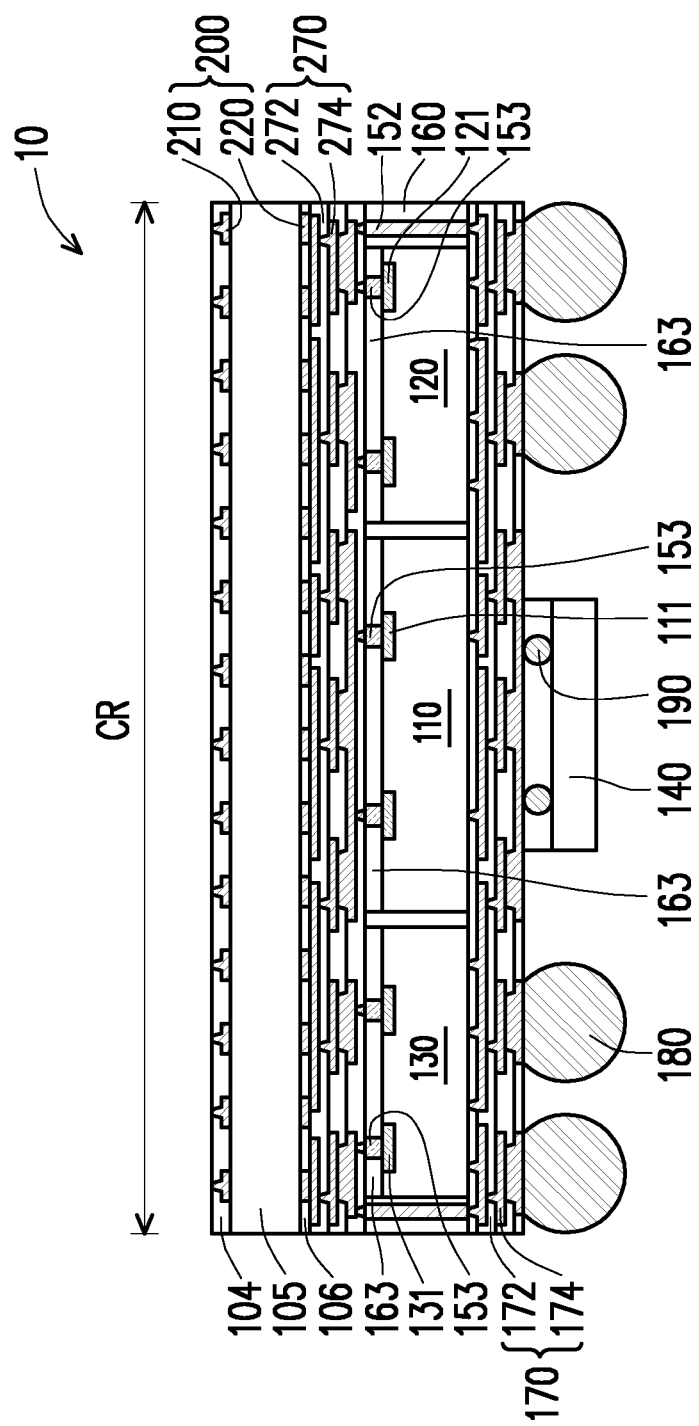
FIG. 8 is a schematic cross sectional view illustrating a package structure according to some exemplary embodiments of the present disclosure.

FIG. 8 is a schematic cross sectional view illustrating a package structure according to some exemplary embodiments. The package structure 10 of FIG. 8 may be fabricated following the previously described manufacturing process as described in FIG. 5A and FIG. 7A-7E. Referring to FIG. 8, in some embodiments, the package structure 10 includes the antenna 200, the second redistribution layer 270, the first die 110, the second die 120, the third die 130, the molding compound 160, the first redistribution layer 170, the fourth die 140 and the conductive elements 180. In some embodiments, the second redistribution layer 270 is disposed on the antenna 200, and the top surfaces of the first die 110, the second die 120 and the third die 130 are disposed on the second redistribution layer 270. In certain embodiments, the first die 110, the second die 120 and the third die 130 are arranged side-by-side, which reduces the thickness of the package structure 10. In some embodiments, the second TIVs 152 are in direct contact with the first redistribution layer 170 and the second redistribution layer 270 and are located there-between. The contacting posts 153 located on the first die 110, the second die 120 and the third die 130 are in direct contact with the contacts 111, 121, 131 and the second redistribution layer 270 through flip chip bonding technology. In one embodiment, the first die 110, the second die 120, the third die 130, the second TIVs 152 and the contacting posts 153 are encapsulated by the molding compound 160, where the top surfaces of the second TIVs 152 are in contact with the first redistribution layer 170. In some embodiments, the first redistribution layer 170 is electrically connected to the first die 110, the second die 120 and the third die 130.

In some embodiments, the molding compound 160 is located between the antenna 200 and the first redistribution layer 170 and between the second redistribution layer 270 and the first redistribution layer 170. In some embodiments, the fourth die 140 and the conductive elements 180 are disposed on the first redistribution layer 170, and the first redistribution layer 170 is located between the fourth die 140 and the molding compound 160 and between the conductive elements 180 and the molding compound 160. In some embodiments, the conductive elements 180 are electrically connected to the first redistribution layer 170 and electrically connected to the first die 110, the second die 120, the third die 130 and/or the antenna 200 through the first redistribution layer 170, the second TIVs 152, the second redistribution layer 270 and the contacting posts 153. In one embodiment, the fourth die 140 is electrically connected to the first redistribution layer 170 through the connectors 190.

In certain embodiments, as shown in FIG. 8, the first die 110 is a 60 GHz radio frequency chip, the second die 120 is a 2.4 GHz radio frequency chip or a 5 GHz radio frequency chip, or a combined 2.4 GHz/5 GHz radio frequency chip, and the third die 130 is a 60 GHz baseband chip. Accordingly, due to the dies of different types in the package structure 10 are stacked at different levels, the package structure 10 has small form factor and further has a much wider frequency range. In one alternative embodiment, the first die 110 is a 60 GHz radio frequency chip, the second die 120 is a 60 GHz baseband chip, and the third die 130 is a 2.4 GHz radio frequency chip or a 5 GHz radio frequency chip, or a combined 2.4 GHz/5 GHz radio frequency chip. However, the disclosure is not limited thereto.

In one embodiment, the antenna 200 is right above the molding compound 160. In some embodiments, a distance of the electrical connection path between the first die 110 and the antenna 200 is smaller than or equal to a distance of the electrical connection path between the second die 120 and the antenna 200 and is smaller than or equal to a distance of the electrical connection path between the third die 130 and the antenna 200. With such specific distance condition, the package structure 10 has better electrical performance.

FIG. 9A to FIG. 9J are schematic cross sectional views of various stages in a manufacturing method of a package structure according to some exemplary embodiments of the present disclosure. The elements similar to or substantially the same as the elements described previously will use the same reference numbers, and certain details or descriptions of the same elements may not be repeated herein. Referring in FIG. 9A, in some embodiments, the connectors 195 are disposed on the second metallic portion 220 of the antenna 200, following the processes as described in FIG. 3A. In some embodiments, the connectors 195 is in direct contact with the second metallic portion 220 of the antenna 200 and is electrically connected thereto. In certain embodiments, the carrier 102 is debonded from the antenna 200 to form a sub-package 20 of the antenna 200. The antenna 200 is easily separated from the carrier 102 due to the debond layer 103 of the carrier 102. In some embodiments, the dielectric layer 104 is debonded from the carrier 102, and the first metallic portion 210 of the antenna 200 is exposed.

Figure 9A:
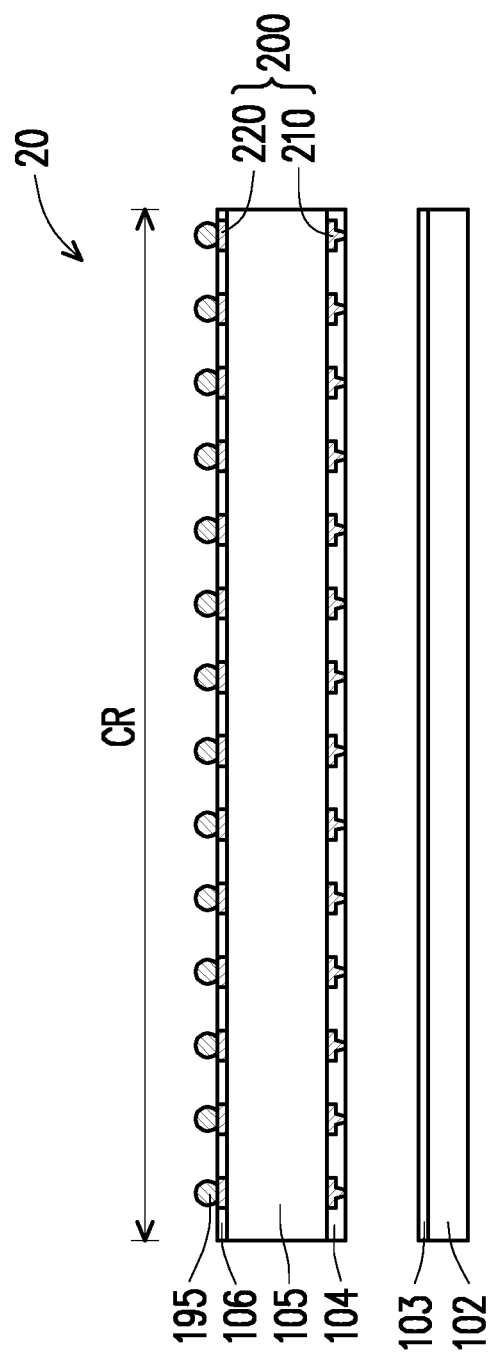
Figure 9B:
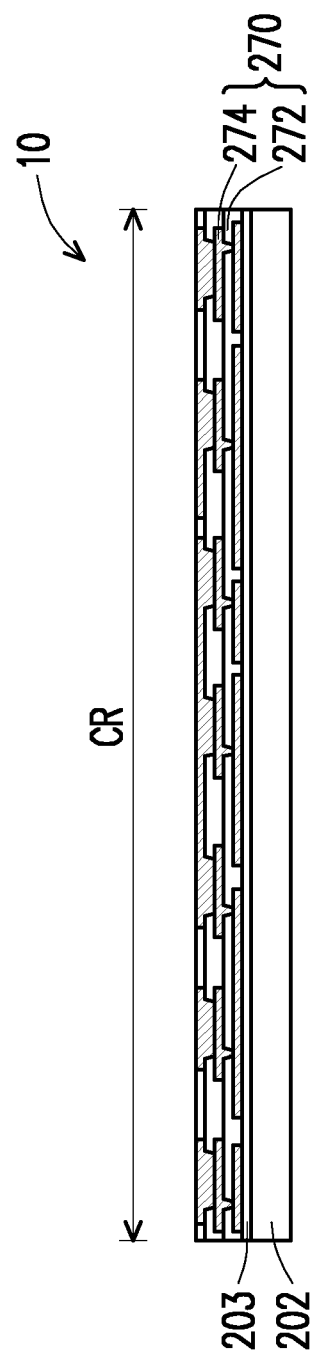

Referring in FIG. 9B, in some embodiments, a carrier 202 is provided, the carrier 202 may be a glass carrier or any suitable carrier for the manufacturing method of the package structure. In some embodiments, the carrier 202 is provided with a debond layer 203 coated thereon, and the material of the debond layer 203 may be any material suitable for debonding the carrier 202 from the above layers disposed thereon; however, the disclosure is not limited thereto. The debond layer 203 may be an optional layer that can be omitted in other embodiments.

In some embodiments, the second redistribution layer 270 is formed on the debond layer 203 disposed on the carrier 202. The materials and formation methods of the second redistribution layer 270 are similar to those described in FIG. 5A and may not be repeated herein. In certain embodiments, the top surface of the topmost layer of the metallization layers 274 is exposed and the lowest layer of the metallization layers 274 is directly connected to the debond layer 203.

Referring in FIG. 9C, in some embodiments, one or more second through interlayer via (TIV) 152 is formed on the exposed the top surface of the topmost metallization layer 274, and the second TIV 152 is directly connected to the top surface of the topmost layer of the metallization layers 274.

Referring in FIG. 9D, in some embodiments, one or more third dies 130 are provided. In some embodiments, the first die 110, the second die 120 and the third die 130 are disposed on the carrier 202. In some embodiments, before disposing the dies on the carrier 202, the first die 110 and the second die 120 are prepared by the process as described in FIG. 1A. In certain embodiments, the first die 110, the second die 120 and the third die 130 are disposed aside the second TIV 152. In some embodiments, the die attach films 161, 162 are provided between the first die 110, the second die 120 and the antenna 200 and between the third die 130 and the first and second dies 110, 120. In certain embodiments, as shown in FIG. 9D, the first die 110, the second die 120 and the third die 130 are front-to-back attached. In some embodiments, before the third die 130 is attached to the first die 110 and the second die 120, the first TIVs 151 are formed on and connected to the contacts 111, 121 of the first and second dies 110, 120.

In certain embodiments, as shown in FIG. 9D, the first die 110 is a 60 GHz radio frequency chip, the second die 120 is a 2.4 GHz radio frequency chip or a 5 GHz radio frequency chip, or a combined 2.4 GHz/5 GHz radio frequency chip, and the third die 130 is a 60 GHz baseband chip. Due to the antenna and the dies of different types in the package structure 10 are stacked at different levels, the package structure 10 has small form factor and further has a much wider frequency range. In alternative embodiment, the first die 110 is a 60 GHz baseband chip, the second die 120 is a 2.4 GHz radio frequency chip or a 5 GHz radio frequency chip, or a combined 2.4 GHz/5 GHz radio frequency chip, and the third die 130 is a 60 GHz radio frequency chip. However, the disclosure is not limited thereto.

Figure 9E:
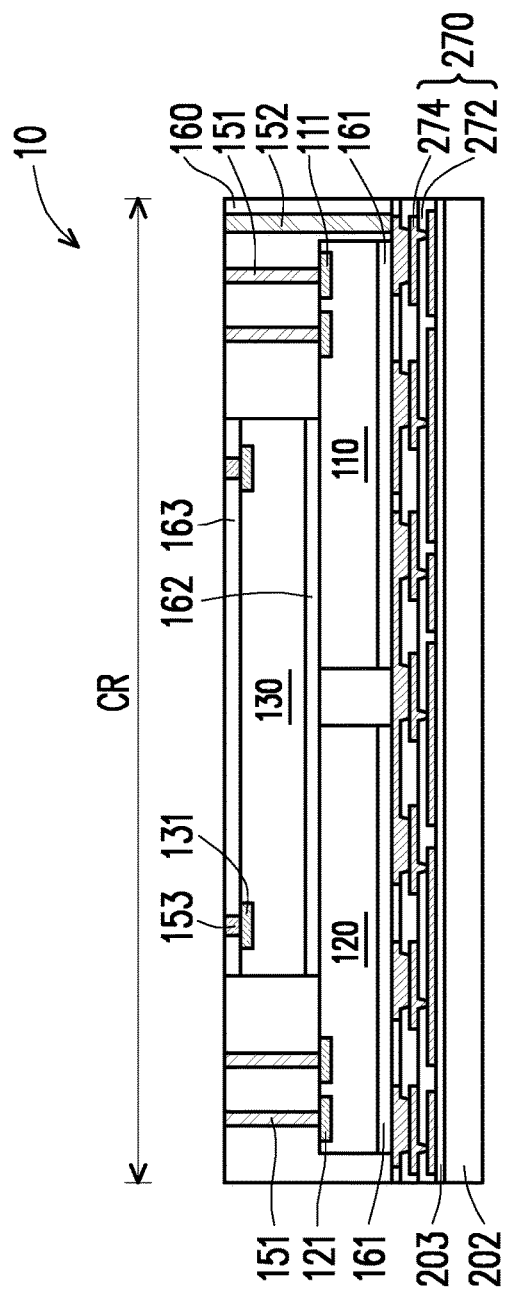

Referring to FIG. 9E, in some embodiments, the first die 110, the second die 120, the third die 130, the first TIVs 151, the second TIVs 152 and the contacting posts 153 are encapsulated in a molding compound 160. In one embodiment, the molding compound 160 at least fills the space between the first die 110, the second die 120, the third die 130, the first TIVs 151 and the second TIVs 152, and covers the second redistribution layer 270. In some embodiments, the molding compound 160 is planarized to expose top surfaces of the first TIVs 151, the second TIVs 152, the contacting posts 153, and the protection layer 163. In certain embodiments, as shown in FIG. 5B, after the planarization, the first TIVs 151, top surfaces of the second TIVs 152 and the molding compound 160 and the third die 130 become substantially levelled. In one embodiment, the top surfaces of the first TIVs 151, the second TIVs 152, the contacting posts 153, the molding compound 160 and the protection layer 163 are coplanar.

Figure 9F:
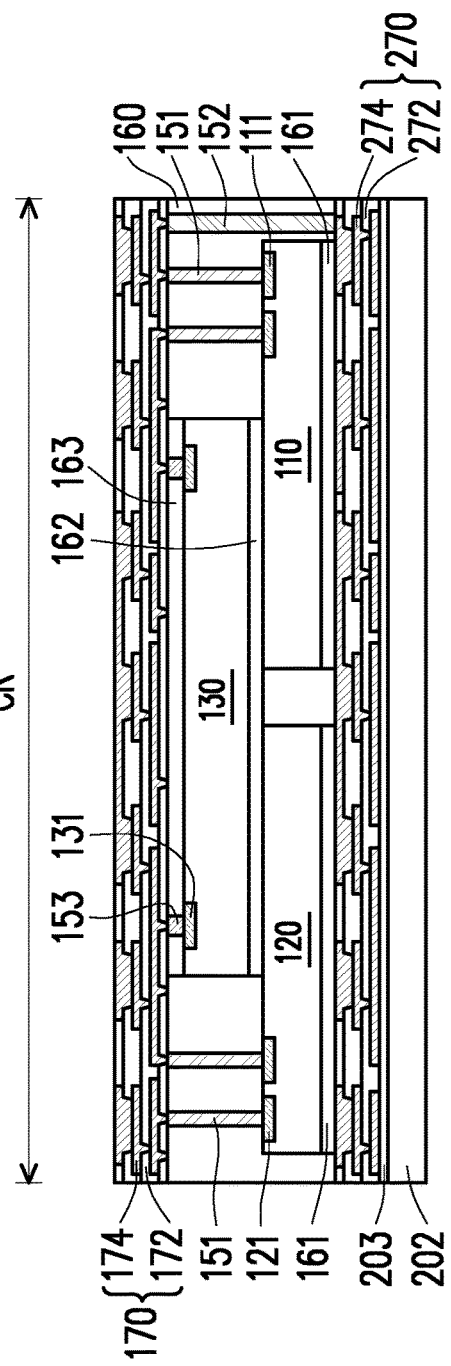

Referring to FIG. 9F, in some embodiments, the first redistribution layer 170 is formed on the molding compound 160, the first TIVs 151, the second TIV 152, the first die 110, the second 120 and the third die 130. In some embodiments, the first redistribution layer 170 is electrically connected to the first die 110 through the contacting posts 153 and electrically connected to the second die 120 and the third die 130 through the first TIVs 151. In some embodiments, the first redistribution layer 170 is electrically connected to the second redistribution layer 270 through the second TIV 152. The materials and the formation methods of the first redistribution layer 170 are similar to those described in FIG. 1E and may not be repeated herein. In certain embodiments, as shown in FIG. 9F, the top surface of the topmost layer of the metallization layers 174 is exposed and the lowest layer of the metallization layers 174 is connected to the first TIVs 151, the second TIV 152 and the contacting posts 153.

Figure 9G:
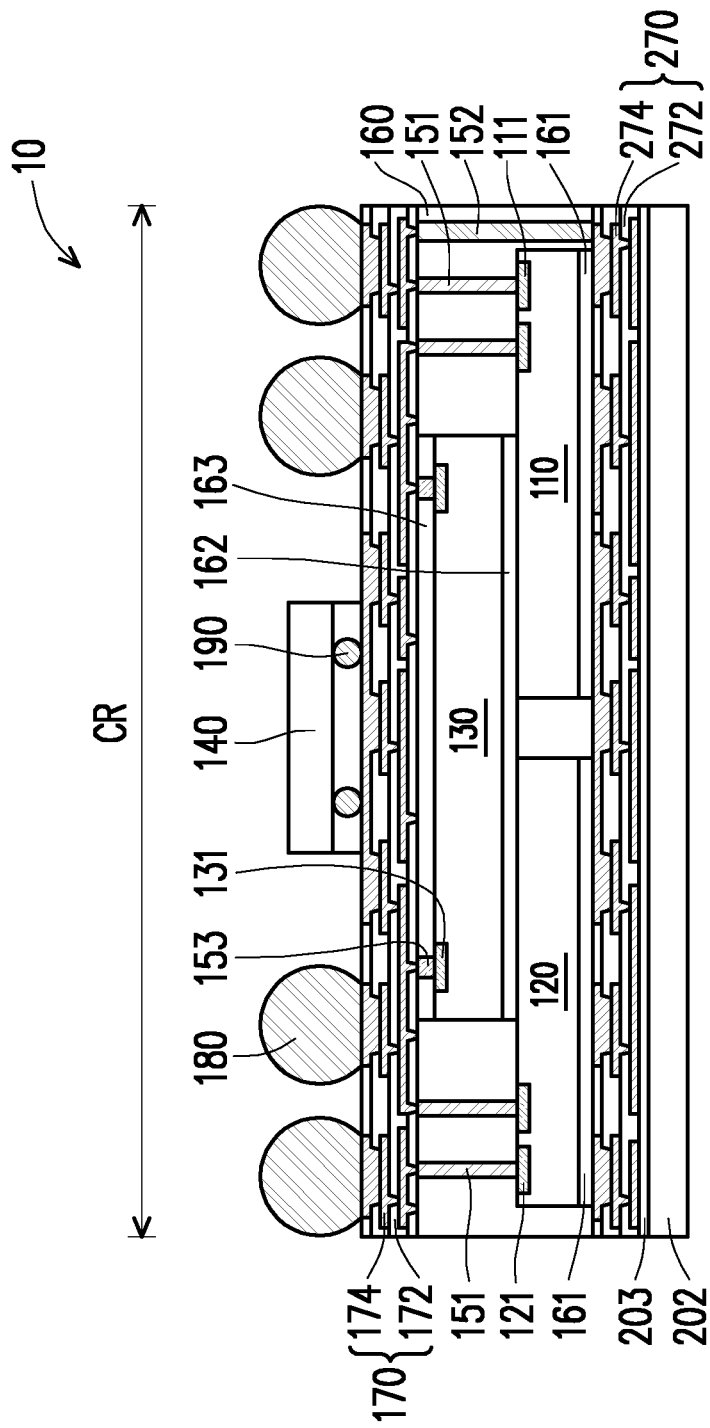

Referring to FIG. 9G, in some embodiments, the conductive elements 180 are disposed on the topmost layer of the metallization layers 174 of the first redistribution layer 170. In some embodiments, some of the conductive elements 180 are electrically connected to the first die 110 through the first redistribution layer 170 and the contacting posts 153, and some of the conductive elements 180 are electrically connected to the second die 120 and the third die 130 through the first redistribution layer 170 and the first TIVs 151.

In some embodiments, the fourth die 140 is disposed on the top surface of the first redistribution layer 170 with connectors 190 there-between. In one embodiment, the fourth die 140 is joined to the first redistribution layer 170 after the conductive elements 180 are disposed. In some embodiments, the fourth die 140 is connected to the first redistribution layer 170 through flip chip bonding technology. In some embodiments, the fourth die 140 may be electrically connected to the first die 110 through the connectors 190, the first redistribution layer 170 and the contacting posts 153, and may be electrically connected to the second die 120 and the third die 130 through the connectors 190, the first redistribution layer 170 and the first TIVs 151. In some embodiments, some of the conductive elements 180 and the fourth die 140 are electrically connected to each other through the first redistribution layer 170.

Figure 9H:
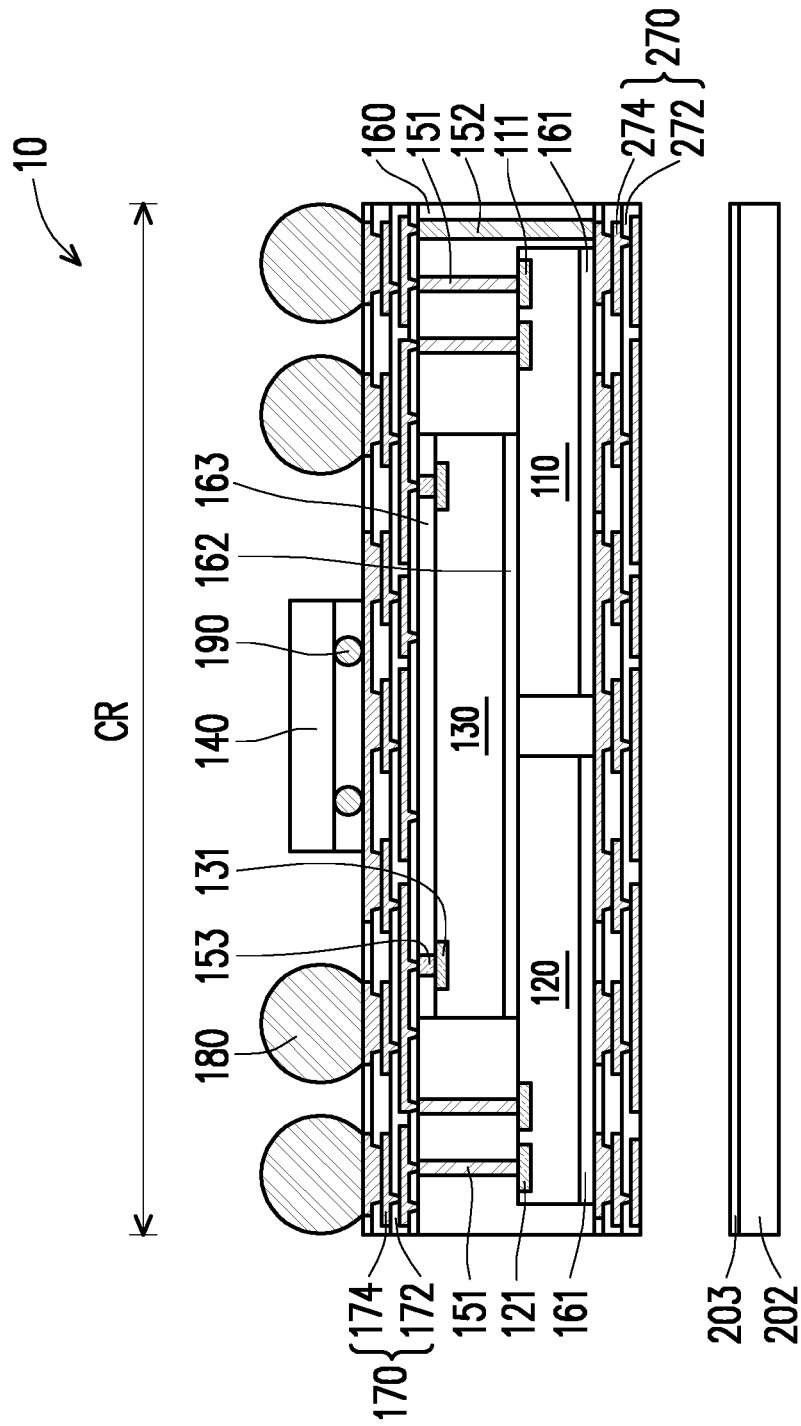

Referring to FIG. 9H, in some embodiments, the carrier 202 is debonded from the second redistribution layer 270. The second redistribution layer 270 is easily separated from the carrier 202 due to the debond layer 203 of the carrier 202. In some embodiments, the second redistribution layer 270 is debonded from the carrier 102, and the lowest metallization layer 274 of the second redistribution layer 270 is exposed.

Figure 9I:
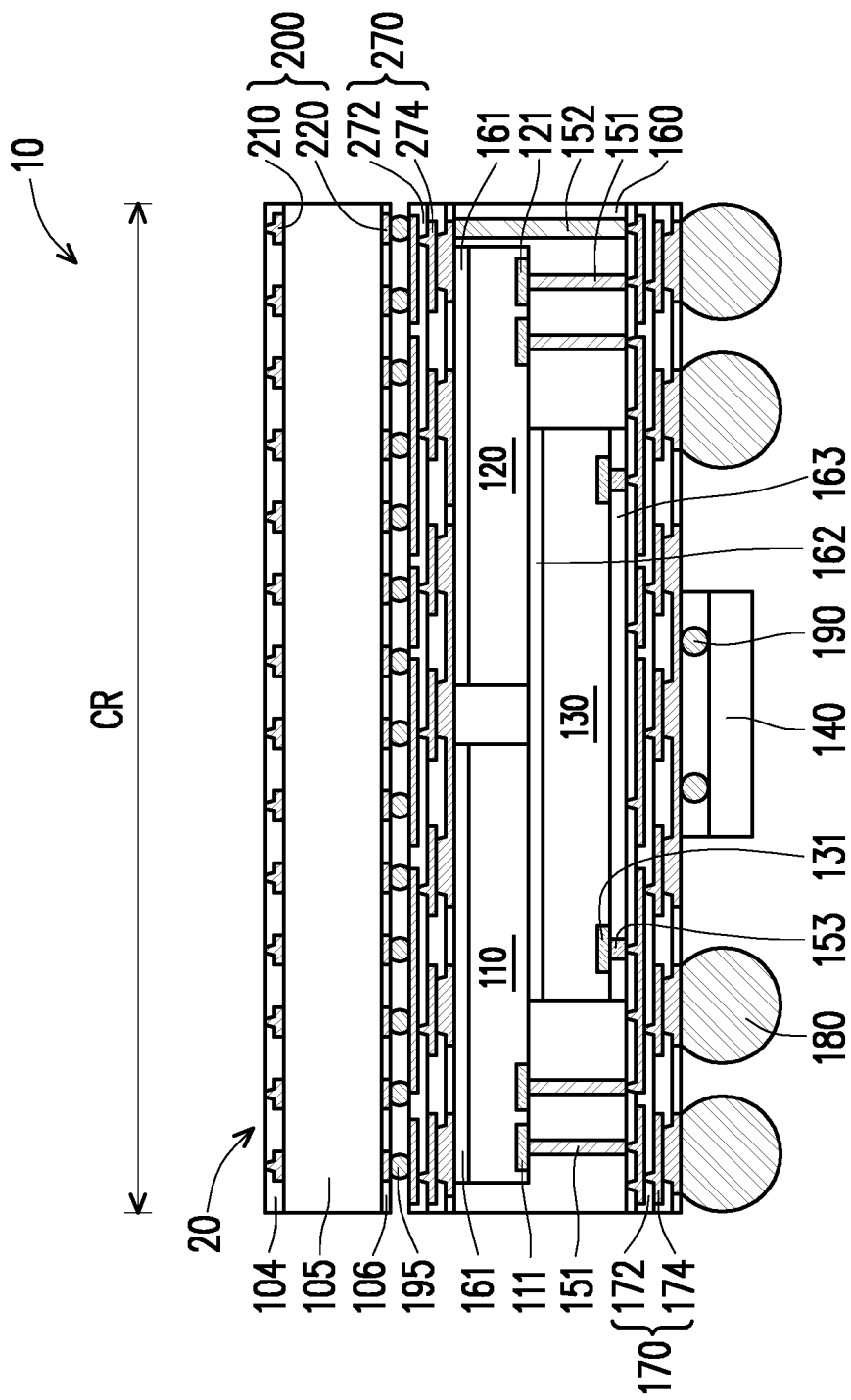

Referring to FIG. 9I, in some embodiments, the sub-package 20 of the antenna 200 is disposed on the second redistribution layer 270 to form the package structure 10 through the connectors 195. In certain embodiments, the connectors 195 of the antenna 200 are disposed on the exposed lowest layer of the metallization layers 274 of the second redistribution layer 270. In some embodiments, the sub-package 20 of the antenna 200 is disposed on the second redistribution layer 270 through flip chip bonding technology and/or surface mount technology. In some embodiments, a distance of the electrical connection path between the first die 110 and the antenna 200 is smaller than or equal to a distance of the electrical connection path between the second die 120 and the antenna 200 and is smaller than or equal to a distance of the electrical connection path between the third die 130 and the antenna 200. With such specific distance condition, the package structure 10 has better electrical performance.

According to some embodiments, a package structure has a first die, a second die, a third die, a molding compound, a first redistribution layer, an antenna, and conductive elements. The first die, the second die and the third die are molded in a molding compound. The first redistribution layer is disposed on the molding compound and is electrically connected to the first die, the second die and the third die. The antenna is located on the molding compound and electrically connected to the first die, the second die and the third die, wherein a distance of an electrical connection path between the first die and the antenna is smaller than or equal to a distance of an electrical connection path between the second die and the antenna and a distance of an electrical connection path between the third die and the antenna. The conductive elements are connected to the first redistribution layer, wherein the first redistribution layer is located between the conductive elements and the molding compound.

According to some embodiments, a manufacturing method of a package structure is provided. A first die, a second die and a third die are disposed on a carrier. The first die, the second die and the third die are encapsulated in a molding compound. The first redistribution layer is formed on the molding compound, wherein the first redistribution layer is electrically connected to the first die, the second die the third die. An antenna is formed on the carrier, wherein the antenna is electrically connected to the first die, the second die and the third die, and a distance of an electrical connection path between the first die and the antenna is smaller than or equal to a distance of an electrical connection path between the second die and the antenna and a distance of an electrical connection path between the third die and the antenna. The conductive elements are disposed on the first redistribution layer, wherein the first redistribution layer is located between the molding compound and the conductive elements. The carrier is debonded from the antenna.

According to some embodiments, a manufacturing method of a package structure is provided. A sub-package is formed by disposing a first die, a second die and a third die on a first carrier; encapsulating the first die, the second die and the third die in a molding compound; forming a first redistribution layer on the molding compound, wherein the first redistribution layer is electrically connected to the first die, the second die, the third die, and the molding compound is located between the first redistribution layer and the first carrier; forming a second redistribution layer on the first carrier, wherein the second redistribution layer is between the molding compound and the first carrier; forming at least one second through interlayer via on the second redistribution layer and encapsulated in the molding compound, wherein the at least one second through interlayer via is electrically connected to the first redistribution layer and the second redistribution layer; disposing conductive elements on the first redistribution layer, wherein the first redistribution layer is located between the molding compound and the conductive elements; and debonding the first carrier. An antenna package is formed by forming a first metal layer on a second carrier; forming a dielectric layer on the first metal layer; forming a second metal layer on the dielectric layer, wherein the dielectric layer is sandwiched between the first metal layer and the second metal layer; and debonding the second carrier. The antenna package is disposed onto the second redistribution layer of the sub-package through flip chip bonding technology and/or surface mount technology, wherein the antenna package is electrically connected to the first die, the second die and the third die, and a distance of an electrical connection path between the first die and the antenna package is smaller than or equal to a distance of an electrical connection path between the second die and the antenna package and a distance of an electrical connection path between the third die and the antenna package.

In accordance with some embodiments, a method of manufacturing a package structure is provided with the following steps, providing a first die, a second die and a third die; forming a first redistribution layer located on and electrically coupled to the first die, the second die and the third die; and forming an antenna located on and electrically coupled to the first die, the second die and the third die, wherein a distance of an electrical connection path between the first die and the antenna is smaller than or equal to a distance of an electrical connection path between the second die and the antenna and a distance of an electrical connection path between the third die and the antenna.

In accordance with some embodiments, a method of manufacturing a package structure is provided with the following steps, disposing a first die, a second die and a third die on a carrier; encapsulating the first die, the second die and the third die in a molding compound; forming a first redistribution layer on the molding compound, wherein the first redistribution layer is electrically connected to the first die, the second die and the third die; forming an antenna on the carrier, wherein the antenna is electrically connected to the first die, the second die and the third die, and a distance of an electrical connection path between the first die and the antenna is smaller than or equal to a distance of an electrical connection path between the second die and the antenna and a distance of an electrical connection path between the third die and the antenna; disposing conductive elements on the first redistribution layer, wherein the first redistribution layer is located between the molding compound and the conductive elements; and debonding the carrier from the antenna.

In accordance with some embodiments, a method of manufacturing a package structure is provided with the following steps, forming a sub-package, comprising: disposing a first die, a second die and a third die on a carrier, encapsulating the first die, the second die and the third die in a molding compound, forming a first redistribution layer on the molding compound, wherein the first redistribution layer is electrically connected to the first die, the second die and the third die, and the molding compound is located between the first redistribution layer and the carrier, forming a second redistribution layer on the carrier, wherein the second redistribution layer is between the molding compound and the carrier, forming at least one through interlayer via on the second redistribution layer and encapsulated in the molding compound, wherein the at least one through interlayer via is electrically connected to the first redistribution layer and the second redistribution layer, disposing conductive elements on the first redistribution layer, wherein the first redistribution layer is located between the molding compound and the conductive elements, and debonding the carrier; providing an antenna package; and disposing the antenna package onto the second redistribution layer of the sub-package, wherein the antenna package is electrically connected to the second redistribution layer and is electrically connected to the first die, the second die and the third die, and a distance of an electrical connection path between the first die and the antenna package is smaller than or equal to a distance of an electrical connection path between the second die and the antenna package and a distance of an electrical connection path between the third die and the antenna package.

In accordance with some embodiments, a package structure includes an insulating encapsulation, a first die, a second die, a third die and an antenna. The first die, the second die and the third die are at least partially covered by the insulating encapsulation and electrically coupled to each other. The antenna is located on the insulating encapsulation and electrically coupled to the first die, the second die and the third die, where the antenna includes a first metallic portion and a second metallic portion. The second metallic portion is mechanically separated from the first metallic portion, and the first metallic portion and the second metallic portion work together in a manner of electrical coupling.

In accordance with some embodiments, a package structure includes an insulating encapsulation, a first die, a second die, a third die, an antenna and a redistribution circuit structure. The first die, the second die and the third die are at least partially covered by the insulating encapsulation and electrically coupled to each other. The antenna is located on the insulating encapsulation and electrically coupled to the first die, the second die and the third die, where the antenna includes a first metallic portion and a second metallic portion. The second metallic portion is mechanically separated from the first metallic portion, and the first metallic portion and the second metallic portion work together in a manner of electrical coupling. The redistribution circuit structure is located over the insulating encapsulation and electrically coupled to the first die, the second die, the third die and the antenna.

In accordance with some embodiments, a package structure includes an insulating encapsulation, a first die, a second die, a third die, a redistribution circuit structure and an antenna. The insulating encapsulation has a first side and a second side opposite to the first side. The first die, the second die and the third die are at least partially covered by the insulating encapsulation and electrically coupled to each other. The redistribution circuit structure is located on the first side of the insulating encapsulation and electrically coupled to the first die, the second die and the third die. The antenna is located on the second side of the insulating encapsulation and electrically coupled to the first die, the second die and the third die, where a distance of an electrical connection path between the first die and the antenna is smaller than or equal to a distance of an electrical connection path between the second die and the antenna and a distance of an electrical connection path between the third die and the antenna. The antenna includes a first metallic portion and a second metallic portion, the second metallic portion is mechanically separated from the first metallic portion, and the first metallic portion and the second metallic portion work together in a manner of electrical coupling. A sidewall of the antenna is substantially aligned with a sidewall of the insulating encapsulation and a sidewall of the redistribution circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a plurality of semiconductor dies;
    an antenna array provided with a first dielectric layer, disposed over the plurality of semiconductor dies, the antenna array comprising a first metallic portion having a plurality of first metallic patterns and a second metallic portion having a plurality of second metallic patterns, wherein the first metallic portion is electrically coupled to the second metallic portion in a manner of wirelessly coupling;
    a plurality of conductive features, disposed between and electrically coupling the plurality of semiconductor dies and the antenna array; and
    a plurality of conductive elements, disposed over the antenna array, wherein the first dielectric layer is between the plurality of semiconductor dies and the plurality of conductive elements.

2. The package structure of claim 1, wherein the first metallic portion is vertically distant from the second metallic portion.

3. The package structure of claim 1, wherein a second dielectric layer is vertically disposed between the first metallic portion and the second metallic portion.

4. The package structure of claim 1, further comprising a redistribution circuit structure between the plurality of semiconductor dies and the antenna array, wherein the redistribution circuit structure includes the plurality of conductive features.

5. The package structure of claim 4, wherein the plurality of conductive features are included in different layers of the redistribution circuit structure, and the different layers are vertically disposed in different elevations from a first outermost surface of the redistribution circuit structure.

6. The package structure of claim 4, wherein the plurality of semiconductor dies are disposed on a second outermost surface of the redistribution circuit structure, the first outermost surface is opposing to the second outermost surface.

7. The package structure of claim 1, further comprising:
    an encapsulant, at least laterally covering the plurality of semiconductor dies and over the antenna array.

8. The package structure of claim 7, wherein the encapsulant partially covers a side of at least one of the plurality of semiconductor dies, and the side of at least one of the plurality of semiconductor dies is facing away from the plurality of conductive elements.

9. The package structure of claim 7, wherein the plurality of conductive features comprise a plurality of conductive pillars partially penetrating the encapsulant.

10. The package structure of claim 1, wherein at least some of the plurality of semiconductor dies are laterally arranged next to each other.

11. A package structure, comprising:
    a circuit structure, comprising a plurality of build-up layers stacked on each other;
    at least one first semiconductor device, disposed over the circuit structure;
    a plurality of antenna patterns, disposed over the at least one first semiconductor device, and comprising a first metallic portion having a plurality of first metallic patterns in a first dielectric layer and a second metallic portion having a plurality of second metallic patterns in a second dielectric layer separated from the first dielectric layer, wherein the first metallic portion is electrically coupled to the second metallic portion in a manner of wirelessly coupling; and an encapsulant, covering a sidewall of the at least one first semiconductor device.

12. The package structure of claim 11, wherein in a vertical projection along a stacking direction of the at least one semiconductor device and the circuit structure, the first metallic portion and the second metallic portion are next to the at least one first semiconductor device.

13. The package structure of claim 11, wherein in a vertical projection along a stacking direction of the at least one semiconductor device and the circuit structure, the first metallic portion and the second metallic portion are overlapped with the at least one first semiconductor device.

14. The package structure of claim 11, further comprising at least one second semiconductor device disposed over and electrically coupled to the circuit structure, and the at least one second semiconductor device is free from the encapsulant.

15. The package structure of claim 11, wherein the plurality of antenna patterns are embedded in the circuit structure.

16. A package structure, comprising:
a plurality of semiconductor dies, laterally disposed next to each other;
a first redistribution circuit structure, vertically disposed over the plurality of semiconductor dies;
an antenna array provided within a dielectric layer, vertically disposed over the plurality of semiconductor dies, and comprising a first metallic portion having a plurality of first metallic patterns and a second metallic portion having a plurality of second metallic patterns, wherein the first redistribution circuit structure is between the antenna array and the plurality of semiconductor dies; and
an encapsulant, covering the plurality of semiconductor dies over the first redistribution circuit structure,
wherein in a cross section along a stacking direction of the plurality of semiconductor dies and the antenna array, the first metallic portion and the second metallic portion of the antenna array are disposed at one side of the plurality of semiconductor dies.

17. The package structure of claim 16, wherein active surfaces of the plurality of the semiconductor dies are closer to the first redistribution circuit structure than non-active surfaces of the plurality of the semiconductor dies.

18. The package structure of claim 16, further comprising:
at least one conductive connector, disposed over and electrically coupled to the first redistribution circuit structure; and
at least one semiconductor device, disposed over and electrically coupled to the first redistribution circuit structure.

19. The package structure of claim 18, wherein the at least one conductive connector and the at least one semiconductor device are laterally disposed next to each, and the plurality of semiconductor dies are disposed between the at least one conductive connector and the first redistribution circuit structure.

20. The package structure of claim 16, further comprising a second redistribution circuit structure vertically disposed over the plurality of semiconductor dies, wherein the plurality of semiconductor dies is disposed between and electrically coupled to the first redistribution circuit structure and the second redistribution circuit structure, and the first redistribution circuit structure is between the antenna array and the plurality of semiconductor dies.

* * * * *